United States Patent [19]

Eccleston

[11] Patent Number: 5,012,181
[45] Date of Patent: Apr. 30, 1991

[54] APPARATUS FOR AND METHOD OF INTERNALLY CALIBRATING AN ELECTRICAL CALIBRATOR

[75] Inventor: Larry E. Eccleston, Edmonds, Wash.
[73] Assignee: John Fluke Mfg. Co., Inc., Wash.
[21] Appl. No.: 8,234
[22] Filed: Jan. 29, 1987
[51] Int. Cl.[5] .................. G01R 35/00; G01R 19/25; G01R 15/12; H03M 1/10
[52] U.S. Cl. ........................ 324/74; 324/115; 341/120; 364/482; 364/483; 364/571.01
[58] Field of Search .............. 324/74, 115; 341/120; 364/482, 483, 571.01

[56] References Cited

U.S. PATENT DOCUMENTS 4,293,916 10/1981 Del Re et al. ............... 364/571
4,337,517 6/1982 Nickel et al. ................ 364/571

OTHER PUBLICATIONS

1978 Wescon *Technical Papers*, Chellstorp et al., "New Concepts in Calibrators", Sep. 1978, pp. 26/4/1–12.
1981 *Internaitonal Test Conference*–Testing in the 1980's, Craven et al., "An 18-Bit Precision DC Measurement System", Oct. 1981, pp. 271–289.

*Primary Examiner*—Stephen M. Baker
*Attorney, Agent, or Firm*—Allan M. Lowe

[57] ABSTRACT

A calibrator supplying electric parameters (viz voltage, current and resistances) over plural ranges to a meter to be calibrated comprises internal components for deriving each parameter over the plural ranges, an internal voltage reference, a DAC, a memory, an analog comparator and analog-to-digital converter. The internal components are connected in circuit with the internal voltage reference, analog-to-digital converter, comparator and memory for writing data signals into the memory indicative of calibration correction factors for the internal components. The internal components are connected in circuit with the memory and DAC so the DAC responds to the stored data signals indicative of the calibration correction factors to enable the value of the parameter supplied to the device by the internal components to be modified and corrected in accordance with the calibration correction for the parameter.

37 Claims, 11 Drawing Sheets

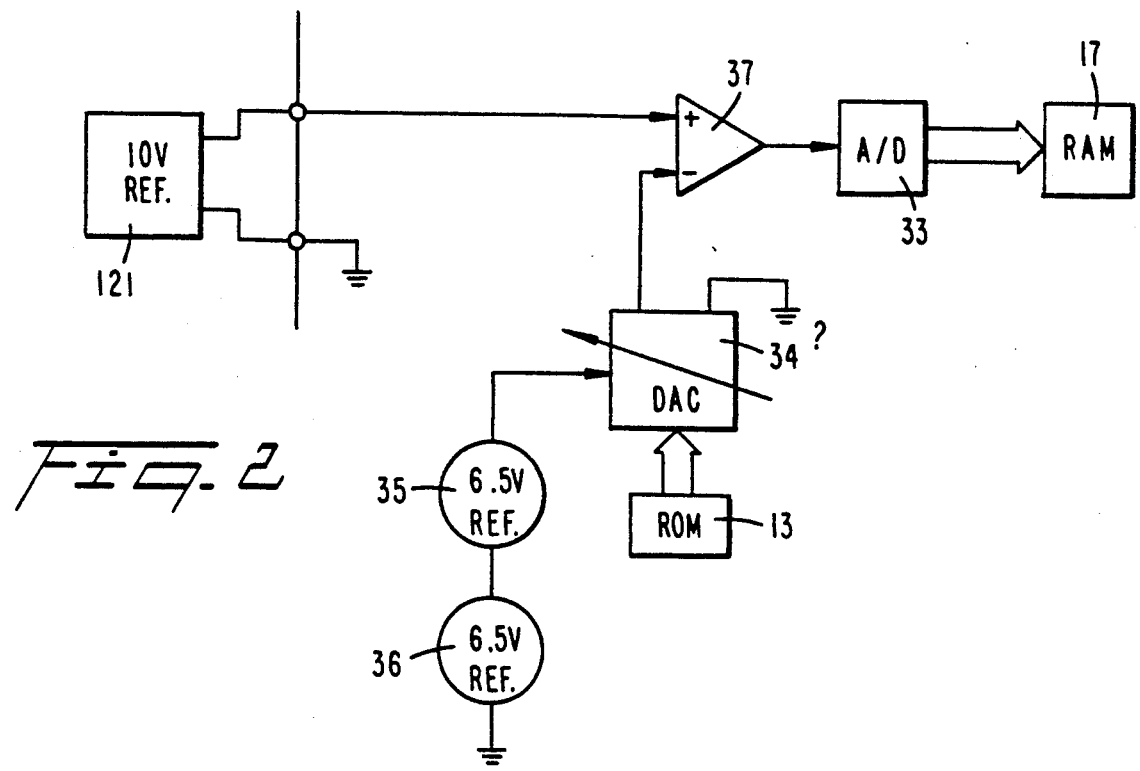
_Fig. 2_
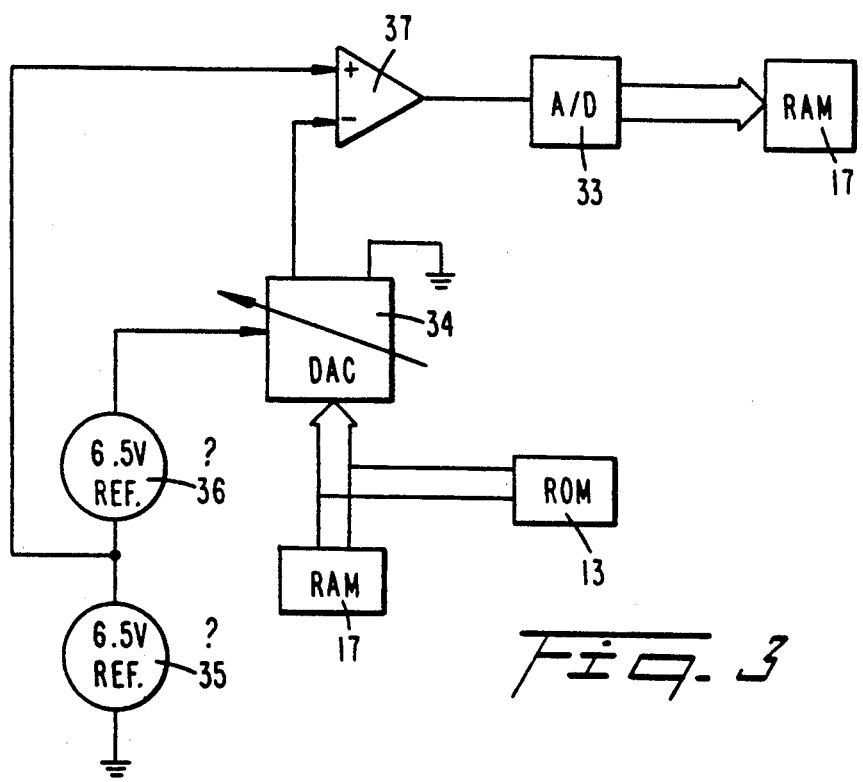
_Fig. 3_

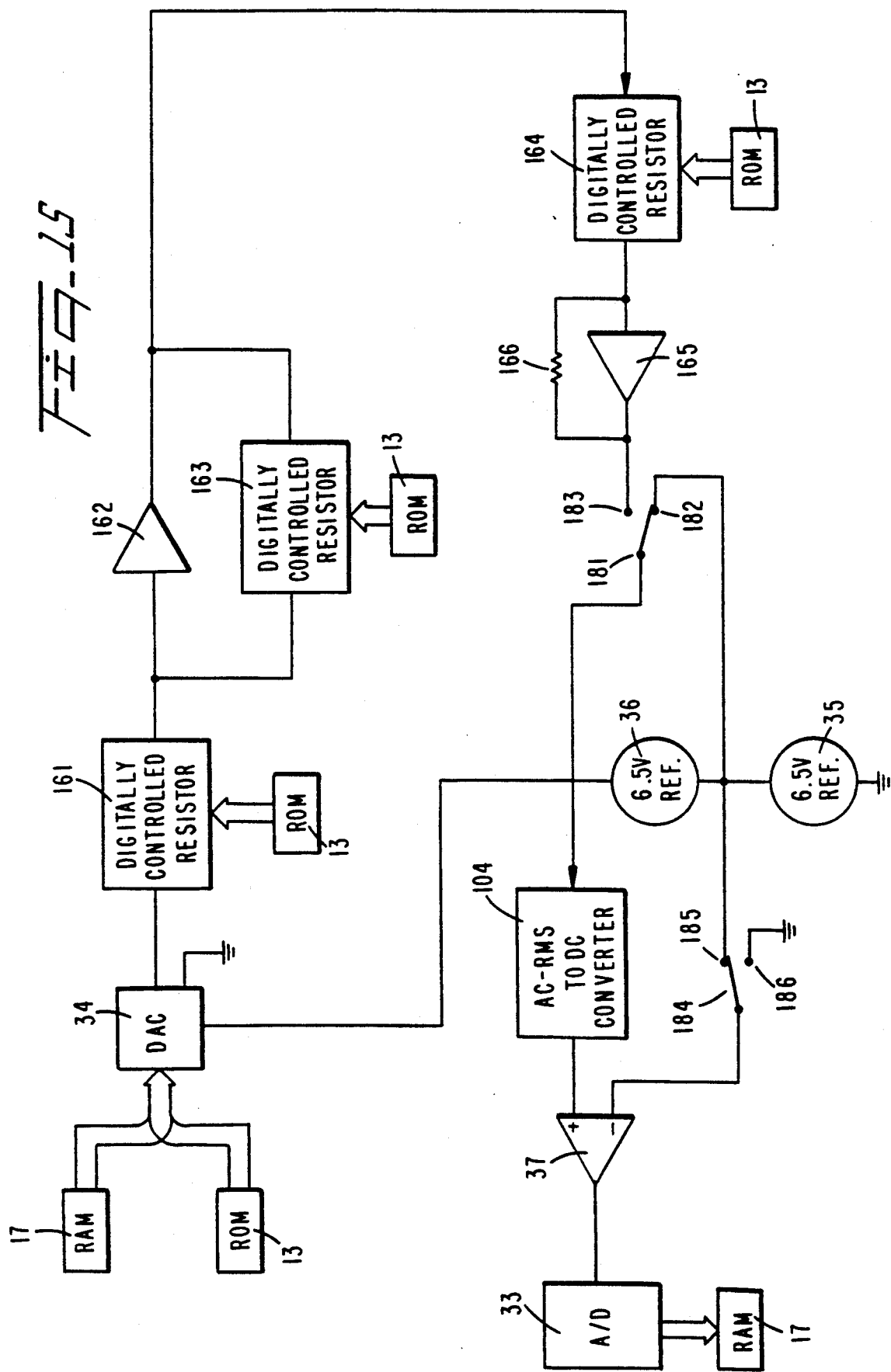

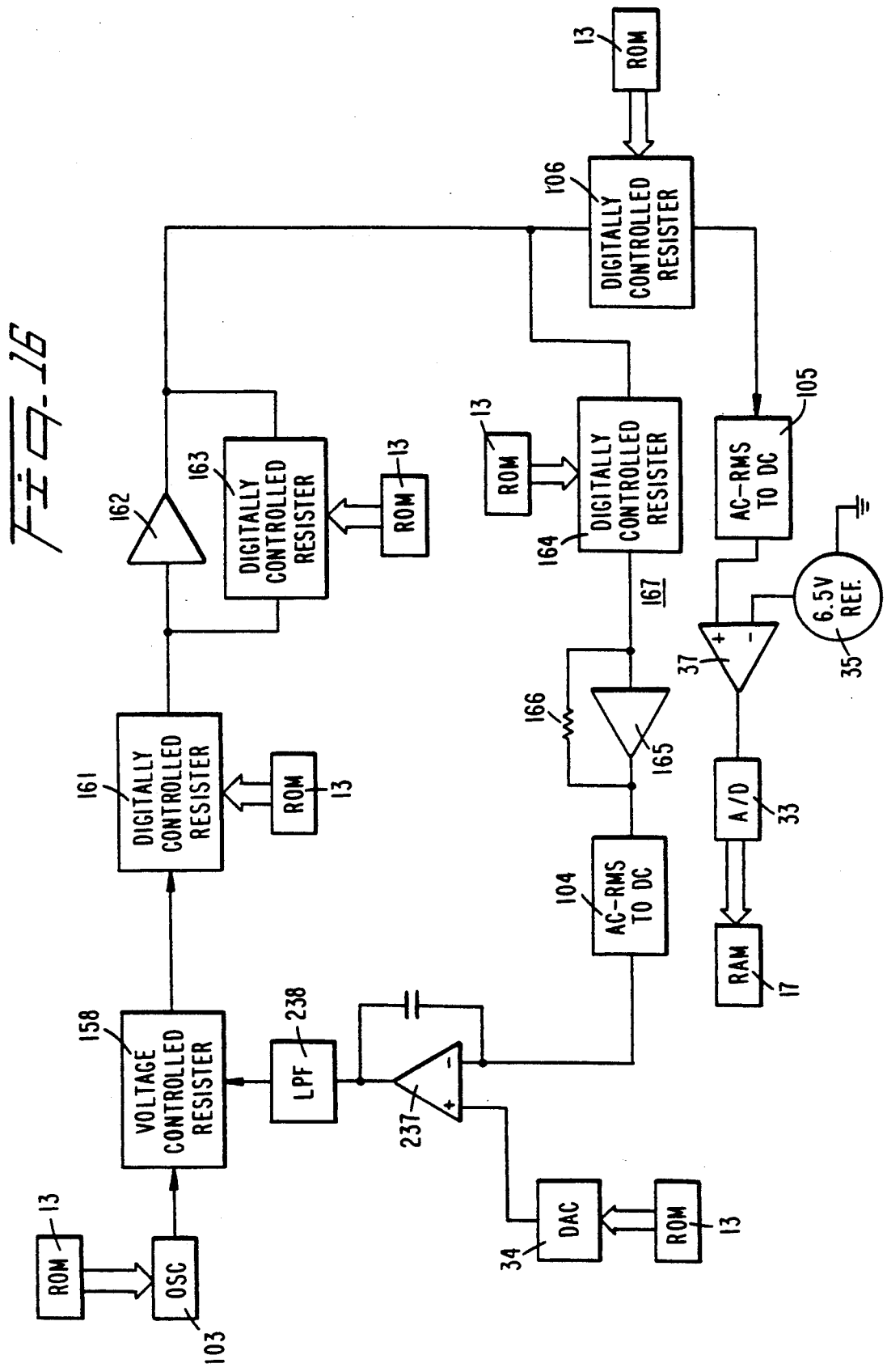

APPARATUS FOR AND METHOD OF INTERNALLY CALIBRATING AN ELECTRICAL CALIBRATOR

TECHNICAL FIELD

The present invention relates generally to calibrating electrical measuring instruments and, more particularly, to a calibrating apparatus that is itself from time to time internally calibrated.

BACKGROUND ART

Calibration of electronic instruments is necessary to ensure accuracy and consistency of measurements made by the instrument. Because characteristics, such as impedance values and amplifier gain, in electric measuring instruments change with time, temperature and other factors, the components of the instruments require periodic calibration to assure measurement accuracy. Prior to the advent of microprocessors, calibrators, i.e., standard sources used to calibrate electric measuring instruments, were generally from time to time calibrated by physically adjusting components in the calibrator so outputs of the calibrator comply with external standards. In complex calibrators, many internal physical adjustments, requiring time-consuming calibration routines often taking many hours, must be made.

With the advent of microprocessors and associated devices, such as random access memories and read-only memories, the calibration process and the apparatus required to achieve calibration have been greatly simplified. Random access memories store calibration correction factors and use software to compensate for gain and zero errors on multiple ranges of different measurements. Modern devices have used microprocessors and electronic memories to store constants based on comparisons to external standards for instrument calibration. The microprocessors and electronic computer memories store internal software and correction factors, almost to eliminate the need to remove covers of the devices. Hence, the need to physically adjust components within the devices has been virtually eliminated.

However, removing the need to make physical adjustments to components within a device such as a measuring instrument is only a small step to reducing the calibration procedure cost. For example, calibration of a multimeter having multiple functions and ranges or a precision source having multiple ranges still requires many different external stimuli to be applied to the instrument or source. The time required to apply these stimuli and the cost involved in supporting the extensive external standards which must be used in the calibration process are contrary to the modern trend of reduced instrument ownership costs.

It is, accordingly, an object of the present invention to provide a new and improved method of and apparatus for calibrating sources used to supply parameters, i.e., voltage, current and impedance, to electric measuring instruments.

Another object of the present invention is to provide a new and improved method of and apparatus for calibrating electric measuring instruments having multiple functions and ranges and/or sources having multiple ranges.

Still another object of the invention is to provide a new and improved apparatus for and method of calibrating electric measuring instruments and/or sources wherein the need to make physical adjustments to components within the calibrator is virtually obviated.

Still another object of the invention is to provide a new and improved electric measuring instrument calibrator having minimum need for external standards.

The problems involved in the use of the prior art manual and electronic techniques and apparatus for calibrating electronic instruments can be understood by considering the example of calibrating a precision DC voltage source. To calibrate such an instrument, whether it has internally stored software constants or requires manual adjustment, typically requires some type of external reference voltage, such as a standard cell, in combination with a null detector to make comparisons, and a multi-range ratio divider. This array of equipment is connected in various configurations to calibrate the millivolt to kilovolt ranges of the source.

The calibration procedure is laborious and repetitive, ideally suited for automation. A prior art DC precision instrument calibrating voltage source, as described in U.S. Pat. Nos. 4,541,065 and 4,585,987, was internally calibrated by a repetitive comparison process between internal responses and external standards for each range. By applying an external 10 volt standard to the source, internal measurements were made in the source and used to characterize the internal reference of the source. Similarly, a comparison to an external divider was made during the calibration process. The comparison to the external divider characterized the resistive ratio within the source. This simple application of artifact standards is needed to perform a full external calibration of the precision DC voltage source.

The greatest workload in calibrating modern electric measuring instruments involves calibrating DC and low frequency multimeter instruments in laboratories of companies that own such instruments or in laboratories where such instruments should be periodically shipped for calibration purposes. Because these multimeters are becoming more accurate as the workload demand increases, the cost of external calibration has or should correspondingly increase.

It is, accordingly, a further object of the present invention to provide a new and improved apparatus for and method of calibrating electronic multimeters.

Still another object of the present invention is to provide a new and improved relatively inexpensive apparatus for enabling electronic multimeters to be from time to time calibrated with a calibrating source that is from time to time automatically internally calibrated.

A further object of the present invention is to provide a new and improved apparatus for and method of calibrating a multimeter with a calibrator that is internally calibrated with a minimum number of external sources, to minimize the cost of ownership by minimizing calibration time of the calibrator.

DISCLOSURE OF INVENTION

In accordance with one aspect of the present invention, a calibrator for meters that measure an electric parameter over plural ranges or several different electric parameters in one or more ranges comprises terminals adapted to supply electric calibrating parameters, such as voltages and/or currents and/or impedances, to corresponding terminals of the meter being calibrated. The calibrating parameters are adjusted to be compatible with each range of the calibrated meter. The calibrator includes internal components associated with measuring the parameter of the plural ranges or the several different parameters in the one or more ranges. The internal components derive voltages and/or currents and/or impedances that are supplied to the calibrator output terminals, thence to the measuring instrument or meter being calibrated.

To calibrate the internal components, the calibrator includes an internal voltage reference, digital-to-analog and analog-to-digital converter means, memory means, and analog comparison means. From time to time, the internal components are connected in circuit with the internal voltage reference, the digital-to-analog converter means, the comparison means and the memory to write data signals indicative of calibration correction factors for the internal components into the memory.

During operation when the calibrator is connected to supply calibrating responses or parameters to a measuring instrument, the calibrator output terminals are connected to respond to responses from the internal components, in turn responsive to the digital-to-analog converter. The digital-to-analog converter responds to stored digital signals representing the nominal values of signals to be applied to the internal components. The nominal values are modified, i.e., incremented and/or decremented, by stored signals indicative of the calibration correction factors for the internal components so a precise parameter is supplied by the calibrator to the meter being calibrated.

The calibrator can be used to derive precise DC and AC calibrating voltages, impedances, and currents over plural ranges. The AC voltage is variable over many frequency and amplitude ranges. The precise AC output for calibrating an external meter is derived by connecting a constant amplitude, variable frequency oscillator to a variable gain amplifier which is connected to drive the meter. The variable gain amplifier output is also supplied to a feedback network including an attenuator and a pair of control loops, each including a separate AC-RMS to DC thermal converter. The amplifier and attenuator are controlled so the inputs to the converters are always in a range which the converters can accurately handle. The first converter supplies a real time, coarse control signal to the variable gain amplifier to maintain the output amplitude to an accuracy of about 0.1%. The second converter is in a longer response time loop including an analog to digital converter, a microprocessor and digital controller to maintain the accuracy of the AC output to about 10 parts per million. The second loop is responsive to stored calibration error signals indicative of low and high frequency calibration errors for components in the control loop.

When the AC calibrating output voltage is to be calibrated, the calibration is performed by connecting a variable amplitude oscillator to the first AC-RMS to DC converter via the variable gain output amplifier and attenuator to outputs of the digital to analog converter. The RMS converter responds to the AC signal supplied to it to derive a DC signal that is compared with the amplitude of a DC voltage derived from the internal voltage reference. The comparison results in derivation of the low frequency calibration error signal that is stored as a calibration correction factor.

To calibrate the amplifier and attenuator for higher frequency output AC voltages, where distributed reactances of the amplifier and attenuator must be considered, the oscillator, amplifier, attenuator and first AC to DC converter are connected in the same way they are connected while a calibrating AC voltage is applied to a meter being calibrated. However the connection from the attenuator to the second converter is broken and the output of the variable gain amplifier is supplied via a variable resistor to the second converter which supplies a signal to one input of a comparator, having a second input responsive to a reference source. The comparator derives calibration error signals for multiple voltages for each higher frequency of the oscillator output by controlling the gain of the variable gain amplifier while it is connected to the oscillator.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWINGS

FIG. 2 is a block diagram of the apparatus illustrated in FIG. 1, when connected for external calibration of a digital-to-analog converter used in the calibrator;

FIG. 3 is a block diagram of the apparatus illustrated in FIG. 1, when connected for internal calibration of DC reference sources employed in the calibrator;

FIG. 15 is a block diagram of the apparatus illustrated in FIG. 1, when connected for internal low frequency (100 Hz or less) calibration of components employed in deriving the AC calibrating voltages; and FIG. 16 is a block diagram of the apparatus illustrated in FIG. 1, when connected for internal high frequency (100 Hz to 1 MHz) calibration of the AC source.

BEST MODE FOR CARRYING OUT THE INVENTION

Figure 1A:
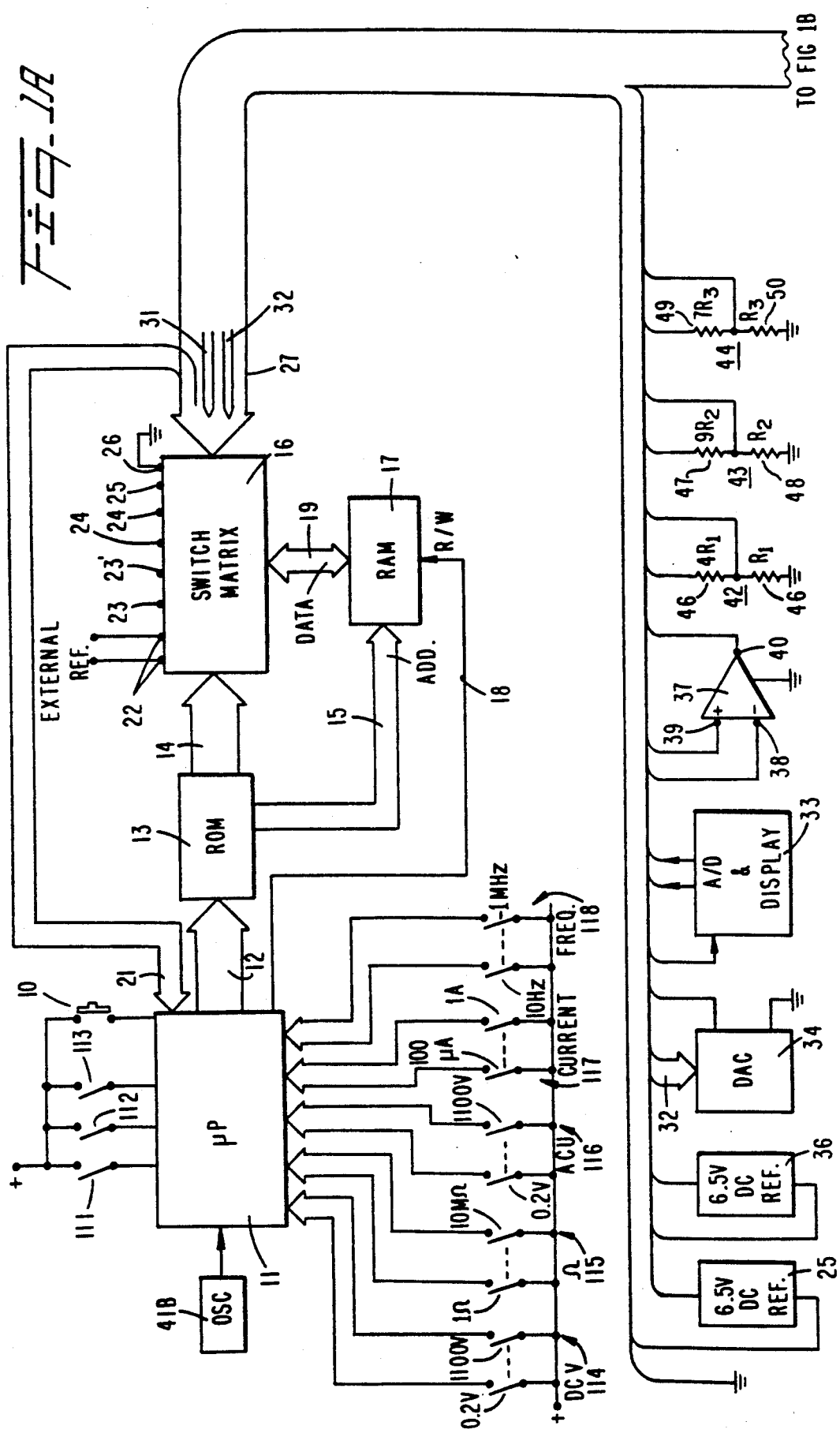
FIG. 1 is an overall block diagram of a calibrator in accordance with a preferred embodiment of the invention.
Figure 1B:
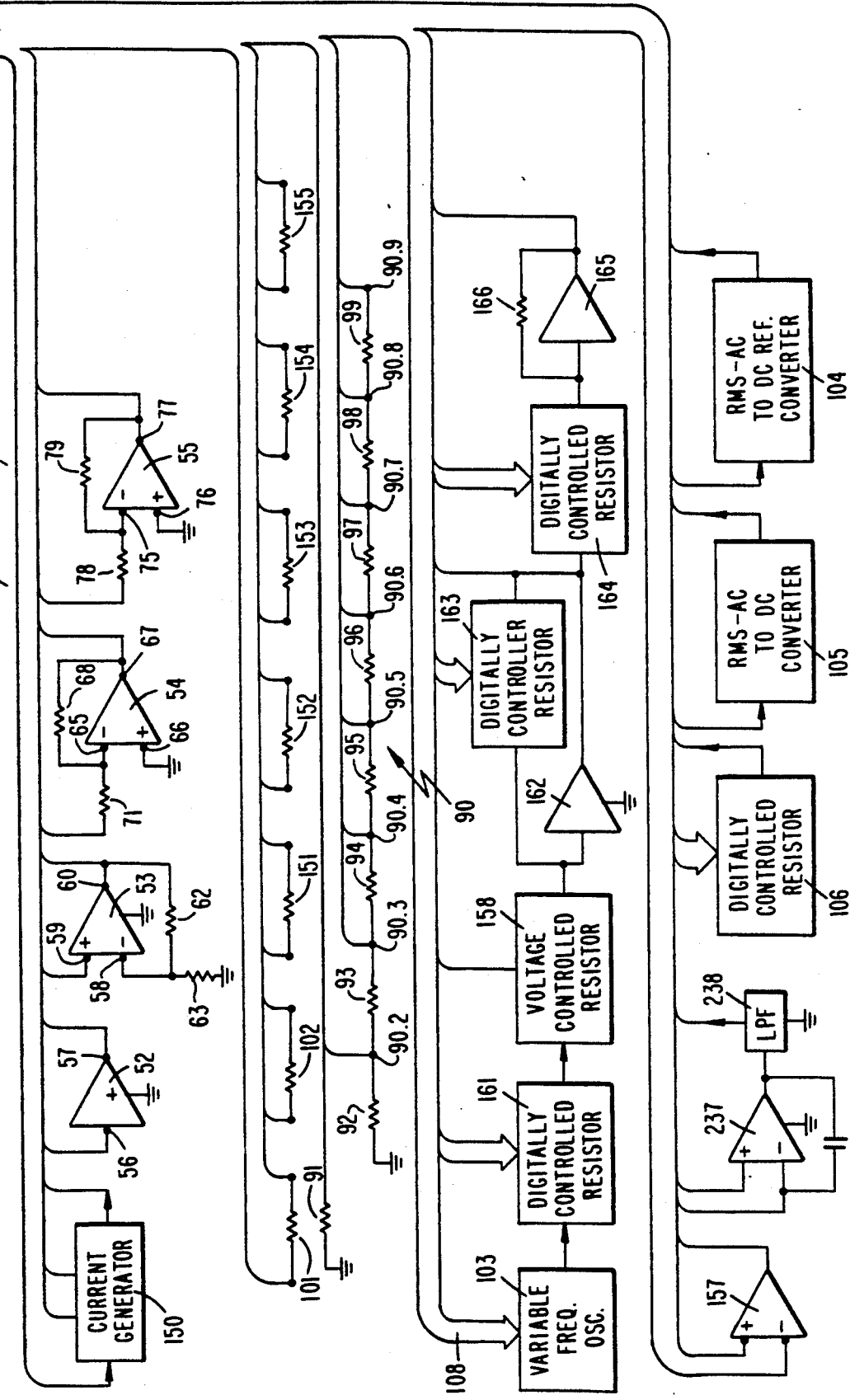

Reference is now made to FIG. 1 of the drawings wherein there is illustrated an overall block diagram of a calibrated source of the present invention. The calibrated source is automatically calibrated by internal circuitry over many ranges of AC and DC voltage, impedance (resistance) and current in response to an operator from time to time activating a single button. The calibrated source requires only three external calibrations which are manually performed at intervals occurring much less frequently than the automatic calibrations.

The calibrated source illustrated in FIG. 1 is capable of supplying calibrated DC and AC voltages and currents, as well as, resistances to meters that measure (a) DC voltages in ranges of 200 millivolts, 2 volts, 10 volts, 20 volts, 200 volts and 1,100 volts, (b) resistances in the ranges of 1 ohm, 10 ohms, 100 ohms, 1,000 ohms, 10,000 ohms, 100,000 ohms, 1 megohm, and 10 megohms, (c) DC current in the ranges of 100 microamps, 1 milliamp, 10 milliamps, 100 milliamps, and 1 amp, and (d) AC voltages at the same amplitude ranges as the DC voltages over a frequency range from 10 Hz to 1 MHz. To these ends, the calibrated source supplies precise voltages and currents to output terminals thereof and connects precise resistances to other output terminals thereof. The calibrated source output terminals are connected by an operator to corresponding input terminals of the meter being calibrated. To derive the precise parameters which are supplied to the calibrated source output terminals, the calibrated source is from time to time automatically internally calibrated in response to the operator activating a single button. The calibrated source is manually calibrated with the external devices at relatively infrequent intervals.

The calibrated source is initially calibrated with an external 10 volt calibration source, as well as external, four-terminal resistors having values of 1 ohm and 10,000 ohms. After the calibrated source has been calibrated by the external sources, it is, from time to time, thereafter internally calibrated over all of the stated ranges for each voltage, current and resistance measurement range. The internal calibrations are performed by comparing responses from internal circuits in the calibrated source with reference voltages generated by a digital-to-analog converter in the calibrated source and storing digital signals representative of deviations of the compared quantities; the deviations represent calibration error factors for the internal circuits. The calibration factors modify the values of nominal reference values generated by the digital-to-analog converter when the calibrated source is used to supply precise DC and AC voltages to a meter being calibrated. The current and resistance calibration factors are supplied to a display so an operator who is calibrating the meter can modify the meter response accordingly. Alternatively if the meter includes a computer, signals from the calibrator modify stored signals in the meter in accordance with the current and resistance calibration errors factors of the calibrated source. The precise parameters supplied to the meter are thus compensated for aging, temperature and other variables that tend to change the values supplied to the calibrated source output terminals.

To perform the calibrations and derive precise outputs, the calibrated source includes microprocessor 11 having a multi-bit output bus 12 which addresses read-only memory (ROM) 13. Memory 13 stores a program that internally calibrates the calibrated source in response to an operator depressing "enter" button 10. Memory 13 also stores instructions or connections to be established when the calibrated source derives precise outputs that are used to calibrate a meter, as well as when the calibrated source is connected to the three external calibrating devices.

Read-only memory 13 includes output buses 14 and 15 which respectively supply switch matrix 16 and random access memory 17 with connection instructions and addresses. RAM 17 responds to the address signal supplied to it by bus 15, as well as a read/write signal from microprocessor 11 on lead 18 to exchange multi-bit data signals on bus 19 with matrix 16. In addition, multiprocessor 11 exchanges multi-bit data signals with switch matrix 16 via bus 21.

Switch matrix 16 includes input terminals 22 adapted to be connected to the 10 volt, 1 ohm and 10 kilohm external calibrating devices. In addition, switch matrix 16 includes "sense high" and "sense low" output terminals 23, 23', "output high" and "output low" terminals 24, 24', guard terminal 25, and ground terminal 26 adapted to be connected via coaxial cables to corresponding terminals of a measuring instrument, e.g. a digital voltmeter, for monitoring AC and DC voltages, resistance and currents in the stated ranges.

Matrix 16 responds to the connection control signals on bus 14 to establish connections between different leads in bus 27, as well as connections between the leads in bus 27 and the devices connected to terminals 22, 23, 23', 24, 24', 25 and 26. In addition, data signals on the leads in bus 27 are written into specified addresses in RAM 17 in response to signals on buses 14 and 15 when the binary signal on lead 18 commands RAM 17 to be in a write state. The signals written into RAM 17 at this time are usually calibration correction signals. When the calibrator is used to supply precise parameters to terminals 23, 23', 24, 24', 25 and 26, the signal on lead 18 commands RAM 17 to be in a read state and the calibration correction factors are read from the RAM at addresses specified by bus 15 to leads in bus 27 via connections established in matrix 16 in response to command signals on bus 14.

The connections established by matrix 16 for the various calibration operations are described in detail in connection with FIGS. 2–16. From the connections described infra in connection with FIGS. 2–16 and other described connections between terminals 22–26 and the meter connected to these terminals, one skilled in the art can determine the nature of the structure within switch matrix 16.

To enable calibration correction signals to be stored in RAM 17 and to enable the calibration correction signals to be used during calibration of a measuring instrument, bus 27 includes sub-buses 31 and 32 for respectively supplying multi-bit digital signals from analog-to-digital converter 33 to RAM 17 and for supplying multi-bit digital signals from the RAM and ROM 13 to digital-to-analog converter (DAC) 34 and to digitally controlled variable resistors. Most of the remaining leads in bus 27 carry analog signals which are derived from and coupled to the remaining components in the calibrator via switch matrix 16. In addition, digital-to-analog converter 34 derives an analog DC signal having a range from 0–22 volts. The output of converter 34 is coupled via bus 27 and switch matrix 16 to the remaining components. Analog-to-digital converter 33 is responsive to an analog signal derived from the remaining components and coupled to it via bus 27 and matrix 16. In general, analog-to-digital converter 33 is used in a differential mode with digital-to-analog converter 34. Converter 34, preferably a pulse width modulated converter with linearity better than one part per million at one-tenth full-scale, includes an accumulator register so that digital signals stored therein can be incremented and/or decremented.

The DC voltage accuracy of the instrument is maintained internally by 6.5 volt DC reference sources 35 and 36, connected to the remainder of the circuitry by leads in bus 27 and switch matrix 16. DC voltage sources 35 and 36 are preferably DC reference operational amplifiers of the type previously used in the Fluke 732A Voltage Standard. This Standard has a stability of better than 0.5 parts per million per month and 2 parts per million per year. The reference amplifiers comprising sources 35 and 36 are maintained at 50° C. on a temperature controlled substrate within the instrument. This environment reduces the temperature coefficient of reference sources 35 and 36 to less than 0.03 parts per million per degree Centigrade, so the instrument has constant performance over a wide temperature range.

To enable the calibration error signals to be derived, the instrument includes a comparison network in the form of DC, differential operational amplifier 37, having inverting and non-inverting input terminals 38 and 39, respectively, as well as output terminal 40, on which is derived an analog signal having a magnitude and polarity indicative of the polarity and magnitude of the difference of the signals at terminals 38 and 39. Terminals 38, 39 and 40 are connected to leads in bus 27, thence via matrix 16 to other components which derive and are responsive to analog signals in the calibrator.

To derive external and/or internal DC calibrating voltages for different ranges, the calibrator includes resistive voltage dividers 42, 43 and 44, respectively having voltage division factors of 1:5, 1:10, and 1:8. Each of dividers 42, 43 and 44 includes a pair of precision thin film resistors such that resistors 45 and 46 of divider 42 have values of $4R_1$ and $R_1$, resistors 47 and 48 of divider 43 have values of $9R_2$ and $R_2$, and resistors 49 and 50 of divider 44 have values of $7R_3$ and $R_3$. One terminal of each of resistors 46, 48 and 50 is grounded, while the other terminal of each of these resistors is a divider tap connected to a separate lead in bus 27 and to a terminal of the remaining resistor of each respective divider. The other terminal of each of resistors 45, 47 and 49 is connected to a separate lead in bus 27.

For internal parameter calibrations, and/or for calibration of meters connected to the calibrator, DC operational amplifiers 52, 53 and 54, as well as power amplifier 55, are included. Amplifier 52 is a buffer amplifier having non-inverting input terminal 56 and output terminal 57 connected to the remainder of the calibrator via leads coupled through bus 27 and switches in matrix 16. Amplifier 53 includes inverting and non-inverting input terminals 58 and 59, as well as output terminal 60, all of which are connected to the remaining components of the calibrator via leads of bus 27 and switches of matrix 16. Connected between terminals 58 and 60 is feedback resistor 62; inverting input terminal 58 is connected to ground via resistor 63. Resistors 62 and 63 respectively have values of $12R_4$ and $R_4$ so amplifier 53 has a nominal gain factor of 13.

Amplifier 54, used for attenuating DC voltages in the 200–1100 volt range to a level compatible with the output of DAC 34 during internal calibration, includes inverting input terminal 65, grounded non-inverting input terminal 66 and output terminal 67. Connected between terminals 65 and 67 is feedback resistor 68, while resistor 71 is connected to inverting input terminal 65. To these ends, one terminal of resistors 71 is connected to the remaining components in the calibrator via leads included in bus 27 and switches in matrix 16, while the other terminal of resistor 71 is connected directly to inverting terminal 65. Output terminal 67 of amplifier 54 is connected to the remaining circuitry in the calibrator via a lead in bus 27 and switches in matrix 16. The values of resistors 68 and 71 are selected so the gain of amplifier 54 is 0.01 whereby the amplifier is a 100:1 attenuator that provides appropriate levels for the 200–1100 DC range for internal calibration.

DC power amplifier 55, used for deriving DC external calibrating voltages in the 20–200 volt and 200–1,100 volt ranges, is designed to have a gain of 20. To these ends, amplifier 55 includes inverting input terminal 75 and grounded non-inverting input terminal 76, as well as output terminal 77. Terminal 75 is connected to fixed resistor 78, having a value $R_5$, and connected to the remaining circuitry of the instrument via a lead of bus 27 and switch matrix 16. For the 200 and 1,100 volt DC external calibrations, resistor 79, having a value of $20R_5$ is connected to terminals 75 and 77 via leads in bus 27 and switch matrix 16.

To calibrate resistance of a meter or output current of the calibrator, resistor chain 90 is selectively connected to the remaining components of the instrument via leads in bus 27 and switch matrix 16. Resistor chain 90 includes thin film resistors 92–98, respectively having values so the resistances at taps 90.2–90.9 are 10 ohms, 100 ohms, 1 kilohm, 10 kilohms, 100 kilohms, 1 megohm, 10 megohms and 100 megohms relative to ground. Each of taps 90.2–90.9 and the ungrounded terminal of resistor 91 is connected to a separate lead in bus 27 so the resistors can be calibrated and used for internal current calibration of the calibrator and resistance calibration of a meter being calibrated. To calibrate the resistors of chain 90 and one ohm resistor 91 ultrastable wire wound resistors 101 and 102, respectively having values of 1 ohm and 10 kilohms, are selectively connected in circuit with the resistors of chain 90 and resistor 91 via connections established through leads in bus 27 and switch matrix 16. Resistors 101 and 102 are also connected in circuit with external precision four terminal calibrating resistors having values of 1 ohm and 10 kilohms connected to terminals 22 via switch matrix 16. The external four terminal resistors enable correction factors to be stored in RAM 17 for resistors 101 and 102. Ultrastable wire wound resistors 101 and 102 typically have very small temperature coefficients, less than 0.3 parts per million per degree Centigrade, and long-term stability in excess of 2 parts per million per year.

To enable constant currents of different values to be established for internal calibration purposes and for calibrating the current response of a meter, the calibrated source includes current generator 150 and resistors 151–155. One of resistors 151–155 is selectively connected to current generator 150 via switch matrix 16 to establish six different current level ranges. Resistors 151-156 need not be overly precise or stable because the current derived from current generator 150 for each of resistors 151-155 connected to the current generator is calibrated with the aid of resistors 91-99.

For AC calibration purposes, the instrument includes variable frequency, fixed amplitude oscillator 103 and root mean square (RMS) to DC converters 104 and 105, preferably Fluke 8506 thermal converters. Digitally controlled, variable resistor 106 is selectively connected to the input of converter 105 for different AC voltage levels. The frequency of the AC voltage derived by source 103 and the value of resistor 106 are controlled by separate multi-bit, digital signals supplied by ROM 13 to buffer registers (not shown) included in the oscillator and digitally controlled resistors of the network; the digital signals are sequentially supplied via matrix 16 to a sub-bus in bus 27. During AC internal calibration and derivation of AC calibrating output voltages, switch matrix 16 responds to digital amplitude control signals from bus 14, as derived from ROM 13, and corrected calibration signals from bus 19, as derived from RAM 17, as well as a variable analog control signal. The variable frequency output of oscillator 103 is connected to variable, voltage responsive resistor 158 that is responsive to a coarse gain control feedback signal on lead or bus 159.

Resistor 158 is connected in series with digitally controlled resistor 161, including an accumulator register responsive to a digital feedback, precise gain control signal from ROM 13 and a calibration correction signal from RAM 17. Resistors 158 and 161 are connected to the input of amplifier 162, including digitally controlled, feedback resistor 163 having a buffer register responsive to a range control, digital signal from ROM 13. The AC output of amplifier 162 is applied via matrix 16 as a calibrating voltage to a meter being calibrated.

During internal calibration of the calibrated source and calibration of an external meter, the output of amplifier 162 is also applied to the input of attenuating network 167, including variable digitally controlled resistor 164, AC amplifier 165 and feedback resistor 166. The value of resistor 164 is responsive to a digital signal derived from ROM 13 and supplied to a buffer register in the resistor via matrix 16. The gain of amplifier 162 and attenuation factor of attenuator 167 are controlled in opposite directions so the output of amplifier 165 is always in the operational range for the inputs of converters 104 and 105. The output of amplifier 165 is selectively coupled to the inputs of converters 104 and 105 via matrix 16, as described infra. Amplifiers 162 and 165 are DC amplifiers capable of handling frequencies over 1 MHz without appreciable attenuation.

Because RMS-to-DC converters 104 and 105 are Fluke Solid State Thermovoltage Converters the outputs of the converter are DC voltages that are truly proportional to the RMS value of the AC inputs to the converters and are not proportional to the peak voltage of the AC inputs. Resistor 106, at the input of converter 105, includes low value passive resistors that are substantially non-inductive and non-capacitive so that they have negligible flatness error, i.e., the values of the resistors do not change as a function of frequency. The input and output of converter 104 are connected to remaining circuits in the instrument via leads of bus 27 and switches in matrix 106 while the outlet of converter 105 is connected to remaining circuits in the instrument via a further lead in bus 27 and switch matrix 16.

Microprocessor 11 is selectively responsive to command signals for the three external calibrations, derived in response to closure of switches 111, 112 and 113. Switches 111, 112 and 113 are closed by an operator when external calibrating devices in the form of a 10 volt DC source, a 1 ohm four-terminal calibrating resistor and a 10 kilohm four-terminal calibrating resistor are respectively connected to terminals 22.

Microprocessor 11 is also responsive to manually controlled inlet signals indicative of the type and range of the output to be supplied by the calibrator to a meter being calibrated, as controlled by switch banks 114, 115, 116, 117 and 118. The switches in banks 114, 115, 116, 117 and 118 are closed by a user of the instrument for a selected one of seven DC voltage ranges, a selected one of eight resistance ranges, a selected one of eight AC voltage ranges, and a selected one of five DC current ranges, and a selected one of seven frequency ranges. Microprocessor 11 is also responsive to oscillator 418 to provide automatic, internal calibration of the device when switch 10 is closed by the operator.

Microprocessor 11 responds to the closure of switches 111-113 to control ROM 13 to derive three sets of address sequences for the ROM, namely for the external DC voltage calibration, and the two external resistance calibrations. Oscillator 41B activates microprocessor 11 to sequence ROM 13 through a series of steps associated with internal calibrations to connect the devices of the calibrator to each other through the leads and sub-buses in bus 27 via matrix 16 and to RAM 17.

In response to an operator closing individual switches in switch banks 114-118 microprocessor 11 supplies command signals to ROM 13, which in turn supplies command signals via buses 14 and 15 to switch matrix 16 and RAM 17 to establish connections between terminals 23-26 and the devices in the calibrator. In response to closure of the switches in banks 114-118 the preferred embodiment of the instrument is capable of providing calibrated AC and DC voltage outputs between 0.2 and 1,100 volts, calibrated resistances having values of between 1 ohm and 10 megohms, and calibrated currents having values of between 100 microamps and 1 amp, and frequencies between 10 Hz and 1 MHz.

During calibration of the devices in the calibrated source in response to the operator closing switch 10 microprocessor 11 supplies a sequence of signals to ROM 13 which in turn commands matrix 16 to establish connections between RAM 17 and the remaining devices in the calibrated source. During calibration of the calibrated source, analog-to-digital converter and display 33 is energized to provide a visual digital indication of the magnitude of the voltage, current and resistance calibration error factors which are determined by the internal calibration routine. The operator can monitor the response of A-D converter 33, as applied to the display, which can include.. a printer, to determine if the calibrated source is functioning properly and to provide a history for the calibrated source.

Reference is now made to FIG. 2 of the drawing wherein there is illustrated a circuit diagram for the connections of the elements illustrated in FIG. 1 for external calibration of internal DC reference sources 35 and 36, as well as digital-to-analog converter 34. During these operations, a 10 volt external reference source 121, preferably a Fluke 732A, is connected to terminals 22 of switch matrix 16. Simultaneously, microprocessor 11 controls ROM 13 so that the ROM derives a multi-bit output signal representing the digital value of 10 volts for a command input signal of digital-to-analog converter 34. Simultaneously, ROM 13 supplies switch matrix 16 with control signals so that the 10 volt representing digital output signal of the ROM is coupled to DAC 34. Simultaneously, ROM 13 controls switch matrix 16 so that DC reference sources 35 and 36 are series connected with each other and to a power input terminal of DAC 34. Switch matrix 16 is also at this time controlled by the output of ROM 13 to establish a connection from the analog output of DAC 34 to the inverting input of difference amplifier 37. Simultaneously, matrix 16 is controlled by the output of ROM 13 to establish a connection from the ungrounded terminal of DC reference source 121 to the non-inverting input of amplifier 37 and the switch matrix is controlled to establish a connection between the output of amplifier 37 and the input of analog-to-digital converter 33.

The output signal of amplifier 37 represents the magnitude and polarity of the difference between the outputs of external reference source 121 and DAC 34. Ideally, the output of difference amplifier 37 is zero under these circumstances. However, because reference sources 35 and 36 and DAC 34 include components that are subject to change as a function of time and temperature, as well as other possible environmental effects, a finite, non-zero signal is usually derived by amplifier 37 with the connections established by switch matrix 16 as illustrated in FIG. 2. The nonzero analog signal derived by difference amplifier 37 is coupled to analog-to-digital converter 33, thence via switch matrix 16 to RAM 17 where it is stored as a calibration correction factor for DC voltage references 35 and 36 and DAC 34.

All of the connections illustrated in FIG. 2 are established in switch matrix 16 in response to an output signal of ROM 13, controlled by an address signal supplied by microprocessor 11 to bus 12. In addition, ROM 13 supplies a signal through switch matrix 16 to the digitial input of DAC 34 via sub-bus 32 of bus 27. The digital output of converter 33 is supplied via sub-bus 31 through switch matrix 16 to an address in RAM 17 controlled by the output of ROM 13 on bus 15 in response to the RAM being activated into the write state by a signal on lead 18.

When digital data signals are subsequently applied to the accumulator register in DAC 34 they are applied as two sequential bytes, respectively derived from ROM 13 and RAM 17. The byte from ROM 13 indicates the nominal magnitude of the analog output signal to be derived from DAC 34, assuming that the DAC requires no calibration correction. The byte from RAM 17 increments or decrements the byte stored in the register of DAC 34 from ROM 13 by an amount equal to the calibration correction factor determined during the operations illustrated in FIG. 2.

After the operations illustrated by FIG. 2 have been performed, oscillator 41B drives microprocessor 11 to an address in ROM 13 which causes the ROM to activate switch matrix 16 to establish the connections illustrated in FIG. 3 for enabling 6.5 volt DC reference source 35 to be internally calibrated. To these ends, DC reference sources 35 and 36 are connected in series with each other to the lower supply input terminal of DAC 34, the digital data input of which is sequentially responsive to a first digital signal from ROM 13 indicative of 6.5 volts and a second digital signal from RAM 17 indicative of the DAC calibration correction factor. The resulting DC voltages derived by DAC 34 and reference 35 are connected to the inverting and non-inverting input terminals of amplifier 37, which derives an error signal that is supplied to analog-to-digital converter 33. Converter 33 derives a digital output signal representing the calibration error of DC reference voltage source 35. The calibration error is stored in RAM 17 at an address designated by the output of ROM 13 that is coupled to bus 15; to these ends, the RAM is activated to the write state in response to the signal on lead 18. The calibration error signal for reference source 35 is subsequently supplied to DAC 34 to increment or decrement the DAC output signal to correct for the calibration error of the reference source.

After the calibration correction error for reference source 35 has been stored in RAM 17, the connections for reference sources 35 and 36 are reversed from those illustrated in FIG. 3 and the calibration error for 6.5 volt DC reference source 36 is derived in the same manner as described for reference source 35.

Figure 4:
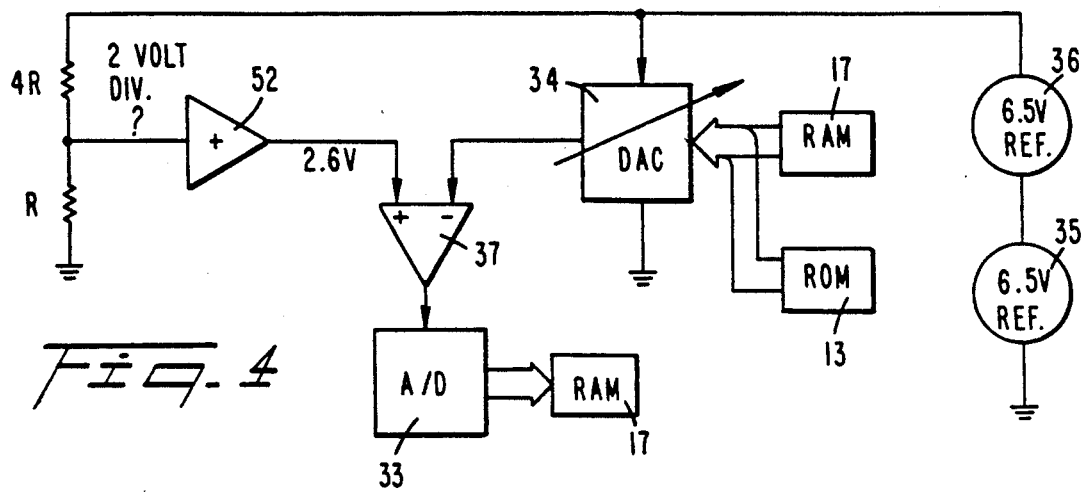
FIG. 4 is a block diagram of the apparatus illustrated in FIG. 1, when connected for internal calibration of the apparatus used to calibrate the 2 volt DC range of a meter.

ROM 13 is then activated in response to the output of microprocessor 11 so that switch matrix 16 is activated to establish the connections illustrated in FIG. 4 which enable 1:5 voltage divider 42 to be calibrated. Voltage divider 34 is connected to a gamut of outputs of DAC 42 ranging between 0 and 10 volts when the calibrated source is used for calibrating a two volt range of a meter. To determine the calibration error of voltage divider 42, DC reference sources 35 and 36 are connected in series with each other and across voltage divider 42, having a tap connected to the non-inverting input of buffer 52. Buffer 52 has a gain of unity, and thereby derives a DC output voltage having a value of 2.6 volts, assuming that voltage divider 42 provides a 1:5 voltage division factor and that the DC series voltage of sources 35 and 36 is 13.0 volts. The output of buffer 52 is compared in difference amplifier 37 with the output of digital-to-analog converter 34, responsive to a digital signal derived from ROM 13 indicative of 2.6 volts and digital signals representing calibration corrections for DC sources 35 and 36 and DAC 34, as derived from the RAM in response to address signals from the ROM.

Difference amplifier 37 responds to the input signal supplied to the inverting and non-inverting inputs thereof to derive an error signal that is coupled to analog-to-digital converter 33. Converter 33 supplies RAM 17 with a digital signal indicative of the calibration error factor of voltage divider 42. RAM 17 responds to the signals on bus 15 and lead 18 to store the calibration error of voltage divider 42 in an address indicated by the signal on bus 15.

When the calibrator of FIG. 1 is set so that the switch in bank 114 associated with the 2 volt DC range is closed the calibrator supplies the measuring instrument being calibrated with a sequence of DC voltages in the 2 volt range via terminals 23' and 26. To these ends, voltage divider 42 is connected across the output of DAC 34 to terminals 23' and 26 via buffer amplifier 52 through switch matrix 16 under the control of a signal derived by microprocessor 11 and coupled as a multi-bit address signal to ROM 13. ROM 13 supplies a signal to bus 14 to close switches in matrix 16 to connect terminals 23' and 6 to the tap of voltage divider 42 via buffer 52 and to connect the output of DAC 34 across divider 42. Simultaneously, ROM 13 supplies DAC 34 with a gamut of digital signals ranging between 0 and 10 volts so the voltage supplied by the tap of divider 42 to the meter being calibrated nominally ranges from 0 to 2 volts. The 0-10 volt representing digital signals are sequentially stored in the buffer register included in DAC 34. For each of the 0–10 volt signals, ROM 13 addresses RAM 17 at the addresses where the calibration error for voltage divider 42 and DAC 34 are stored. The calibration errors for voltage divider 42 and DAC 34 are supplied by RAM 17 to the register in DAC 34 to increment and/or decrement the digital signals stored therein indicative of the DAC output commensurate with the 0–10 volt range.

Figure 5:
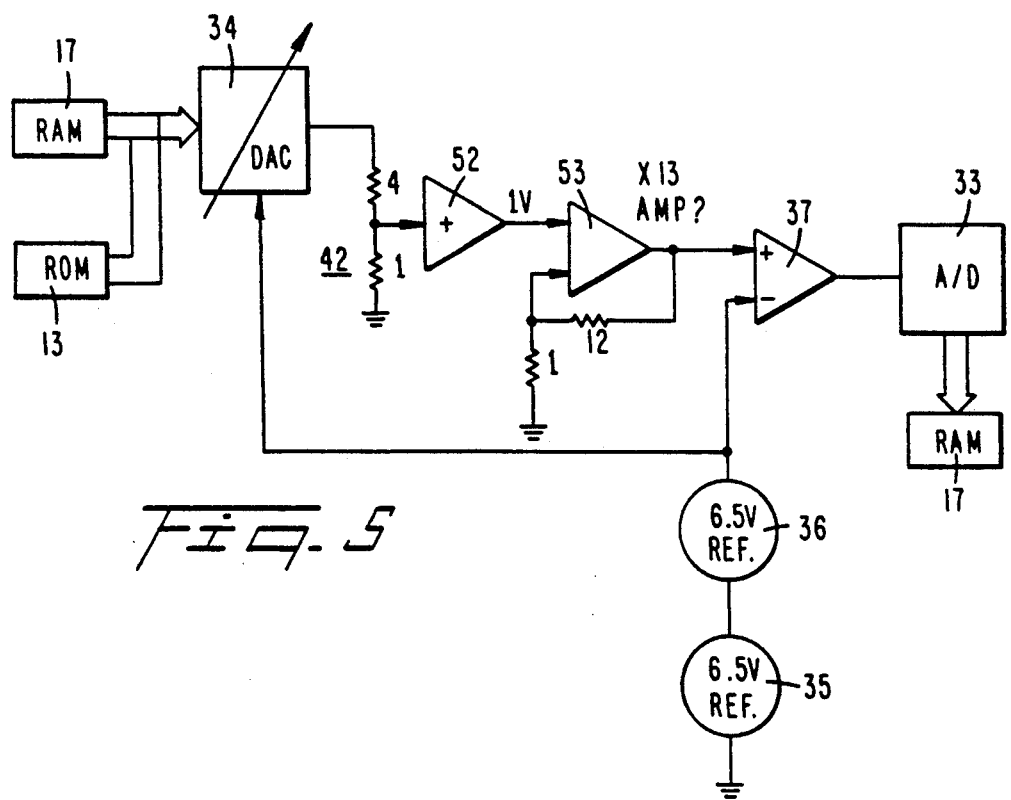
FIG. 5 is a block diagram of the apparatus illustrated in FIG. 1, when connected for internal calibration of an amplifier employed in the calibrator.

For internal and external calibrations in certain ranges, it is necessary to use amplifier 53, designed to have a nominal gain of 13. The calibration error factor for the gain of amplifier 53 is obtained by connecting the elements of the instrument through switch matrix 16 in the manner illustrated in FIG. 5 The connections illustrated in FIG. 5 are established after the calibration connections illustrated in FIG. 4 have been made and the calibration error of voltage divider 42 has been stored in RAM 17.

To calibrate amplifier 53, ROM 13 is controlled by microprocessor 11 to supply DAC 34 with a DC power supply voltage via the series connection of DC reference sources 35 and 36 and a digital signal which causes the DAC to derive an output level of 5 volts. The signal supplied by ROM 13 to the register in DAC 34 is modified, i.e. incremented and/or decremented, by calibration error representing signals for DC references 35 and 36, AC 34 and voltage divider 42, as derived from RAM 17.

Switch matrix 16 is then activated to connect the output of DAC 34 to voltage divider 42 simultaneously with the tap of the voltage divider being applied to buffer 52 via switch matrix 16. The nominal one volt DC level at the output terminal of buffer amplifier 52 is applied to the non-inverting input terminal of amplifier 53 which derives a DC output voltage having a nominal value of 13 volts that is coupled to the non-inverting input of amplifier 37. The inverting input of amplifier 37 responds to the voltage across series connected DC reference sources 35 and 36 so the amplifier derives a difference output signal representing the calibration error of amplifier 53. The calibration representing analog error signal derived from amplifier 37 is supplied to analog-to-digital converter 33, which in turn derives a digital signal representing the calibration error for amplifier 53. The digital calibration error representing output signal of converter 33 for amplifier 53 is stored in RAM 17 at an address controlled by the signal on bus 15 under the control of a write signal on lead 18. Amplifier 53 is used for internal calibration and to assist in deriving DC external calibrating voltages in the 200–1,100 volt range, as described infra.

Figure 6:
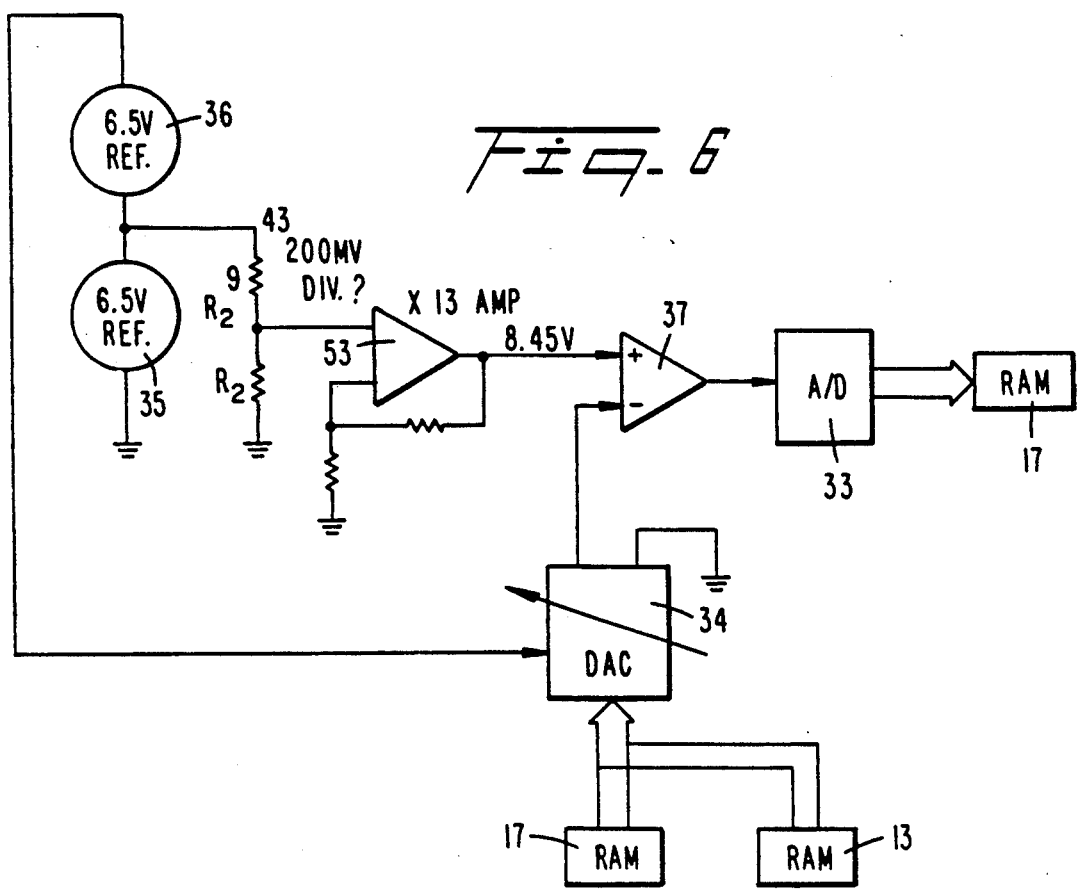
FIG. 6. is a block diagram of the apparatus illustrated in FIG. 1, when connected for internal calibration of the apparatus used to calibrate the 200 millivolt DC range of a meter.
Figure 7:
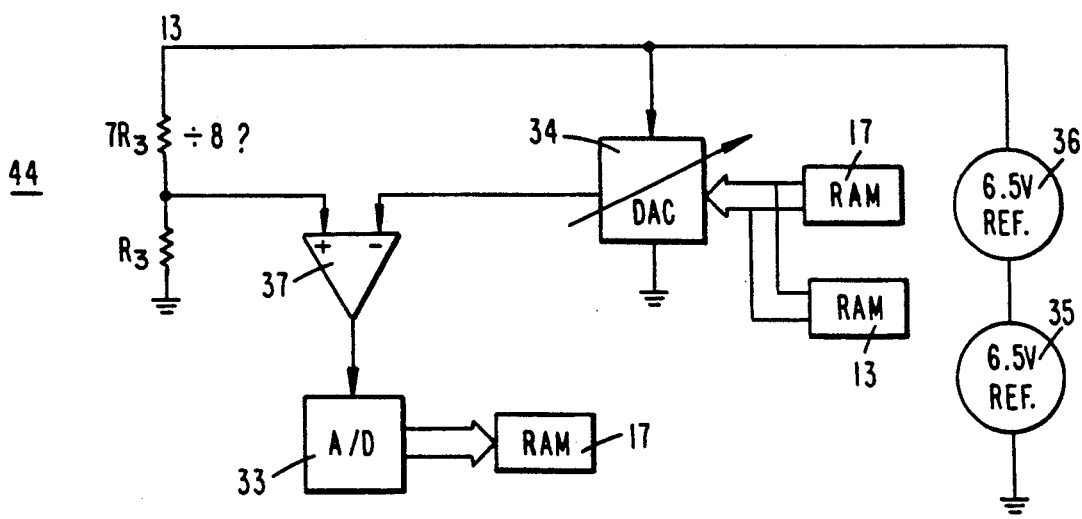
FIG. 7 is a block diagram of the apparatus illustrated in FIG. 1, when connected for internal calibration of a voltage divider of the calibrator.
Figure 8:
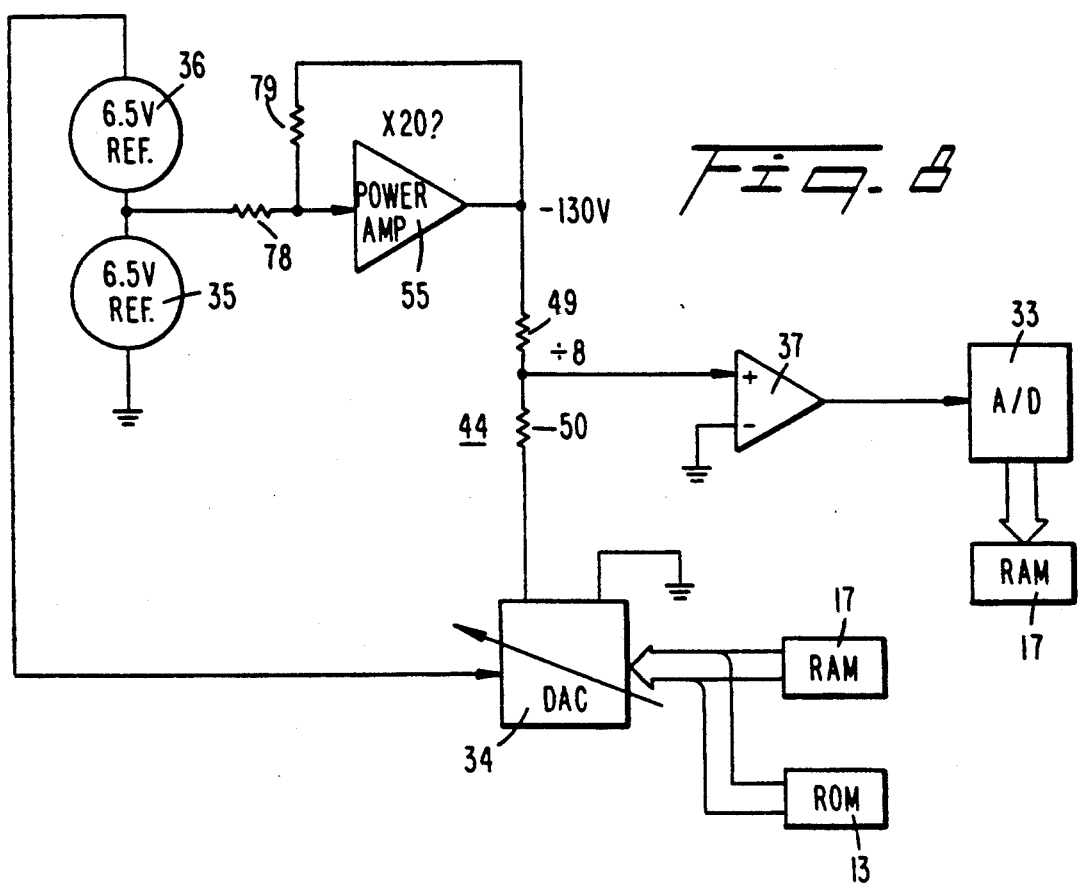
FIG. 8 is a block diagram of the apparatus illustrated in FIG. 1, when connected for internal calibration of the apparatus used to calibrate the 200 volt DC range of a meter.

The next step in the calibration process causes microprocessor 11 to activate ROM 13 so that switch matrix 16 connects the instrument components in the configuration illustrated in FIG. 6, employed to determine the calibration error for 1:10 voltage divider 43. Voltage divider 43 is connected to DAC 34 to assist in deriving external DC calibrating voltages in the 200 millivolt range.

To calibrate 1:10 voltage divider 43, the inverting input terminal of amplifier 37 is responsive to a nominal 8.45 volt DC output of DAC 34. The actual output of DAC 34 deviates from 8.45 volts by the calibration error factors of DAC 34, amplifier 53 and DC reference voltage source 35. To these ends, the accumulating register of DAC 34 is supplied by ROM 13 with a signal representing a nominal DAC output of 8.45 volts. The signal in the accumulating register in DAC 34 is incremented and/or decrement&ed by the calibration error representing signals for the DAC, reference source 35 and amplifier 53 while the DC is lowered by the DC voltage resulting from sources 35 and 36 being connected in series with each other. Thereby, the DAC derives a calibrated output of about 8.45 volts.

Simultaneously, matrix 16 connects the voltage of source 35 across voltage divider 43, having a tap connected to the non-inverting input terminal of amplifier 53. The output voltage of amplifier 53, nominally having a value of 8.45 volts, is supplied to the non-inverting input terminal of amplifier 37, the inverting input of which is responsive to the output signal of DAC 34. Difference amplifier 37 derives a DC voltage having a magnitude proportional to the calibration error factor of voltage divider 43. The output signal of difference amplifier 37 is supplied to the input of analog-to-digital converter 33 which derives digital signal which is coupled to a designated address in RAM 17 under the control of the signals on bus 15 and lead 18.

To derive voltages in the 200 millivolt range, terminals 23' and 26 are connected to the tap of voltage divider 43 and ground while the voltage divider is energized by DAC 34. DAC 34 is supplied by ROM 13 with a gamut of digital signals enabling the DAC to derive DC outputs from 0 to 2 volts so the voltage between the tap of divider 43 and around varies from 0 to 200 millivolts. Each digital signal supplied by ROM 13 to DAC 34 is incremented and/or decremented by the calibration correction signals stored in RAM 17 for the DAC, reference sources 35 and 36, and divider 43 so the voltages at the tap of divider 43 are accurate calibrating voltages in the 0 to 200 millivolt range.

To calibrate the calibrated source for output voltages thereof in the 20–200 volt range 1:8 voltage divider 44 is employed. Voltage divider 44 is calibrated by activating switch matrix 16 to establish the connections illustrated in FIG. 7 after voltage divider 43 has been calibrated by using the circuit configuration of FIG. 6.

To determine the calibration error of voltage divider 44, switch matrix 16 is activated so that DC voltage reference sources 35 and 36 are connected in series with each other to the power supply terminal of DAC 34 and across voltage divider 44. ROM 13 is activated so that DAC 34 is supplied with a digital input signal which commands the DAC to derive an output signal having a nominal value of 1.625 volts. The signal from ROM 13 is incremented or decremented by output signals of RAM 17 associated with the calibration error factors of DAC 34, as well as DC voltage references 35 and 36. The voltage at the tap of voltage divider 44 and the output of DAC 34 are supplied to the non-inverting and inverting input terminals of difference amplifier 37 which derives a DC analog voltage having a value directly proportional to the calibration error of voltage divider 44. The output signal of amplifier 37 is supplied to analog-to-digital converter 33, which in turn derives a signal that is supplied to a designated address in RAM 17 for the calibration error factor of voltage divider 44.

Voltage divider 44 is employed for calibrating DC voltage sources in the calibrator for voltages in the 20–200 volt range, as derived from amplifier 55. Therefore, after voltage divider 44 has been calibrated power amplifier 55, designed to have a nominal gain of 20, is calibrated by microprocessor 11 commanding ROM 13 to activate switch matrix 16 so the calibrator components are connected in the manner illustrated in FIG. 8.

To calibrate amplifier 55, DC reference source 35 supplies a 6.5 volt DC input to power amplifier 55, which responds to it to derive a DC output level having a nominal value of −130 volts. The negative output of amplifier 55 is applied to a terminal of resistor 49 of voltage divider 44 simultaneously with DAC 34 supplying resistor 50 with a DC level having a nominal value of 18.571 volts. To these ends, DAC 34 responds to an output of ROM 13 associated with a DC level of 18.571 volts and to calibrating correction error signals from RAM 17 associated with the DAC, reference source 35, and voltage divider 44. The voltage at the tap between resistors 49 and 50 is applied to the non-inverting input terminal of difference amplifier 37, while the inverting input terminal of the difference amplifier is grounded. Difference amplifier 37 derives a DC voltage having a magnitude and polarity indicative of the calibration error of power amplifier 55. If the gain of power amplifier 55 is exactly 20, the voltage at the tap between resistors 49 and 50 is zero. The output of amplifier 37 is supplied to analog-to-digital converter 33, which derives a digital output signal that is supplied to a designated address in RAM 17.

To derive calibrating voltages between 20 and 200 volts, the output of DAC 34 is connected to the input of amplifier 55 via resistor 78 and the amplifier output is connected to an input terminal of the meter being calibrated. These connections are established via switch matrix 16 under the control of ROM 13 in response to an operator input to switches 116 for the 20–200 volt range. The DAC is responsive to a sequence of input signals from ROM 13 for nominal output voltages of the DAC between 1 and 10 volts and to input signals from RAM 17 that increment and/or decrement the DAC output in accordance with calibrating errors for the DAC and amplifier 55. Thereby amplifier 55 derives a sequence of calibrating output voltages between 20 and 200 volts which are applied to the meter being calibrated.

Amplifier 55 is also used to calibrate a 100:1 voltage divider that is used for internal calibration in the 200–1,100 volt range. The 100:1 voltage attenuator includes amplifier 54, feedback resistor 68 and input resistor 73; resistors 68 and 73 have appropriate values to provide the 100:1 voltage attenuation.

Figure 9:
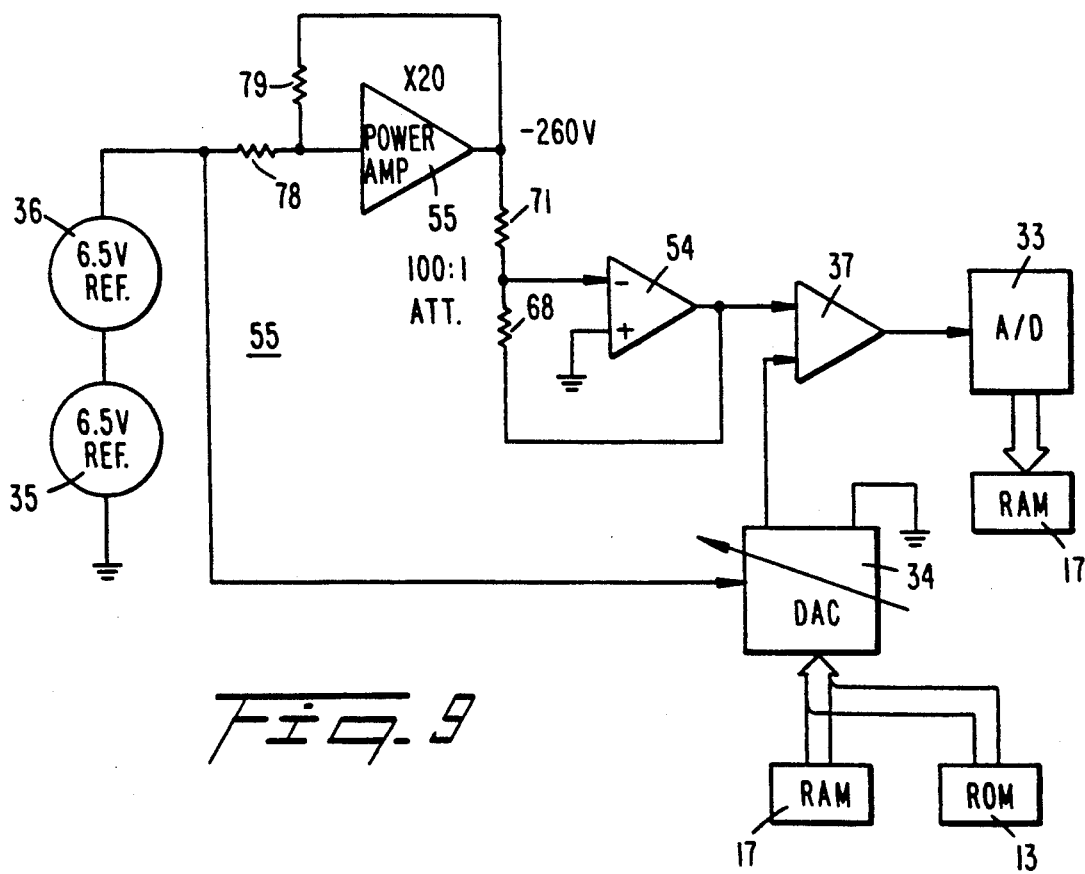
FIG. 9 is a block diagram of the apparatus illustrated in FIG. 1, when connected for internal calibration of some of the apparatus used to calibrate the 1100 volt DC range of a meter.

The circuitry for calibrating the 100:1 voltage divider is illustrated in FIG. 9 as including the series combination of DC voltage sources 35 and 36 which power DAC 34 and supply 13.0 volts to the signal input terminal of power amplifier 55. Amplifier 55 thereby derives a DC output having a nominal level of −260 volts. The −260 volt output of amplifier 55 is supplied to the 100:1 attenuator including resistors 68 and 71 and amplifier 54, which derives an output signal having a nominal value of +2.6 volts.

Simultaneously with the +2.6 volt output being derived from amplifier 54, DAC 34 derives an output voltage that is controlled by ROM 13 and RAM 17. ROM 13 is activated by microprocessor 11 to derive a digital signal having a value corresponding with a nominal 2.6 volt output of the DAC. Thereafter, ROM 13 controls RAM 17 to read out digital signals corresponding with the calibration correction errors of DAC 34, voltage references 35 and 36 and power amplifier 55. Amplifier 37 responds to the output signals of amplifier 54 and DAC 34 to derive a calibration correction factor for the 100:1 attenuator, which is applied to analog-to-digital converter 33. Converter 33 responds to the output of amplifier 37 to supply an address in RAM 17 with the calibration correction factor for the 100:1 attenuator.

To derive calibrating voltages in the 200–1,100 volt range for a meter to be calibrated, amplifiers 53 and 55, respectively having gains of 13 and 20, are series connected with each other to be responsive to a sequence of voltages ranging from 0.77–3.85 volts, as derived from DAC 34. The 200–1,100 volt output of amplifier 55 is coupled via output terminals of the calibrator to input terminals of a meter being calibrated. The connections are established via matrix 16 and DAC 34 is sequenced under the control of signals from ROM 13 in response to the operator activating the switch in bank 116 associated with the 200–1,100 volt range. DAC 34 responds to signals from ROM 13 to derive signals having nominal values of between 0.77–3.85 volts. The nominal value signals are incremented and/or decremented by a signal from RAM 17 representing the calibration error of the calibrator through the gamut of values between 200 and 1,100 volts.

To determine the calibration error of the calibrator between 200 and 1,100 volts ROM 13 controls matrix 16 so amplifiers 53 and 55 are cascaded so the 6.5 volt output of DC reference source 35 is applied to amplifier 53 and the output of amplifier 55 is connected to the 100:1 attenuator including amplifier 54 and resistors 68 and 71. The resulting nominal 16.9 volt output of amplifier 54 is compared in amplifier 37 with the output of DAC 34, controlled by ROM 13 to have a nominal value of 16.9 volts. The nominal value is incremented and/or decremented by the calibration correction errors for amplifiers 53 and 55, as well as the 100:1 attenuator, as supplied to DAC 34 by RAM 17.

Figure 10:
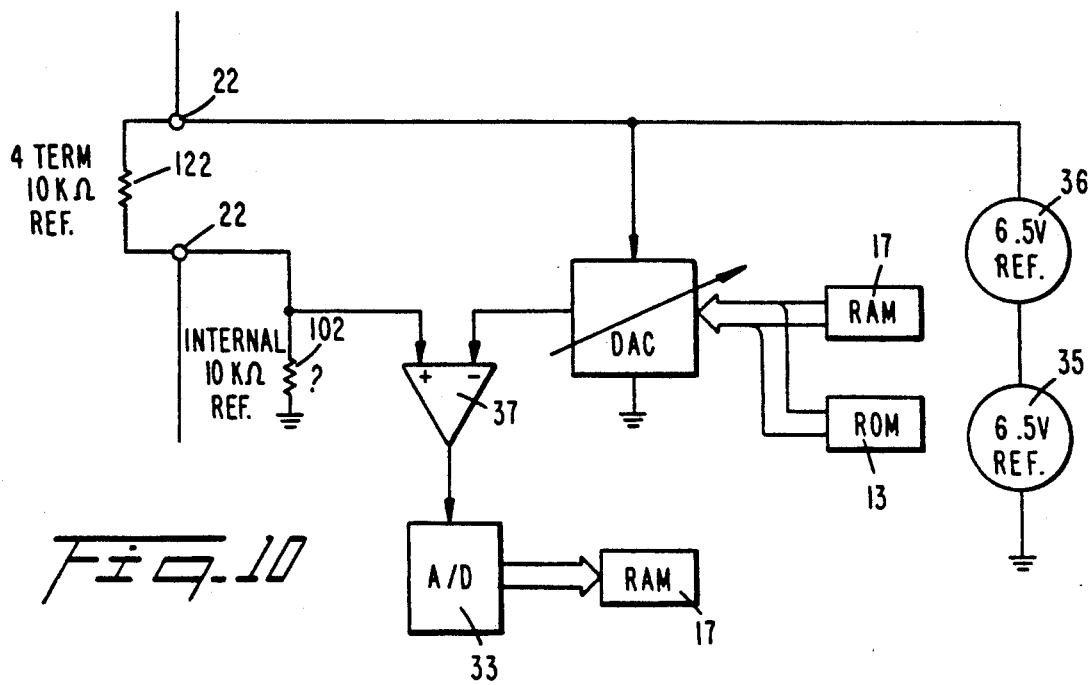
FIGS. 10 and 11 are block diagrams of the apparatus illustrated in FIG. 1, when respectively connected for external, calibration of internal 10 kilo-ohm and 1 ohm resistances.

To calibrate 10 kilohm resistor 102, employed as a reference resistance in combination with resistive voltage divider network 90 for resistance calibration, switch matrix 16 is activated by ROM 13 to establish the circuit illustrated in FIG. 10. Resistor 102 is calibrated while four-terminal 10 kilohm reference resistor 122 is connected by an operator to terminals 22. One terminal of resistor 122 is connected to the 13.0 volt level derived by connecting sources 35 and 36 in series with each other, simultaneously with DAC 34 being powered by the 13.0 volt level. Switch matrix 16 connects terminals 22 in series with internal reference resistor 102 that is being calibrated. A tap between resistors 102 and 122 is connected to the non-inverting input of difference network 37, whereby the non-inverting input terminal of network 37 is responsive to a voltage having a nominal value of 6.5 volts. Simultaneously, the inverting input of difference network 37 responds to the output of DAC 34 while the DAC is responsive to a signal from ROM 13 which causes the DAC to derive an output voltage having a nominal value of 6.5 volts. DAC 34 is then supplied by RAM 17 with calibration correction signals for the DAC and for sources 35 and 36 Network 37 responds to the input signals thereof to derive a DC voltage having a value directly proportional to the calibration error factor for resistor 102. Converter 33 responds to the output of network 37 to supply RAM 17 with a digital signal indicative of the calibration error factor of resistor 102.

Figure 12:
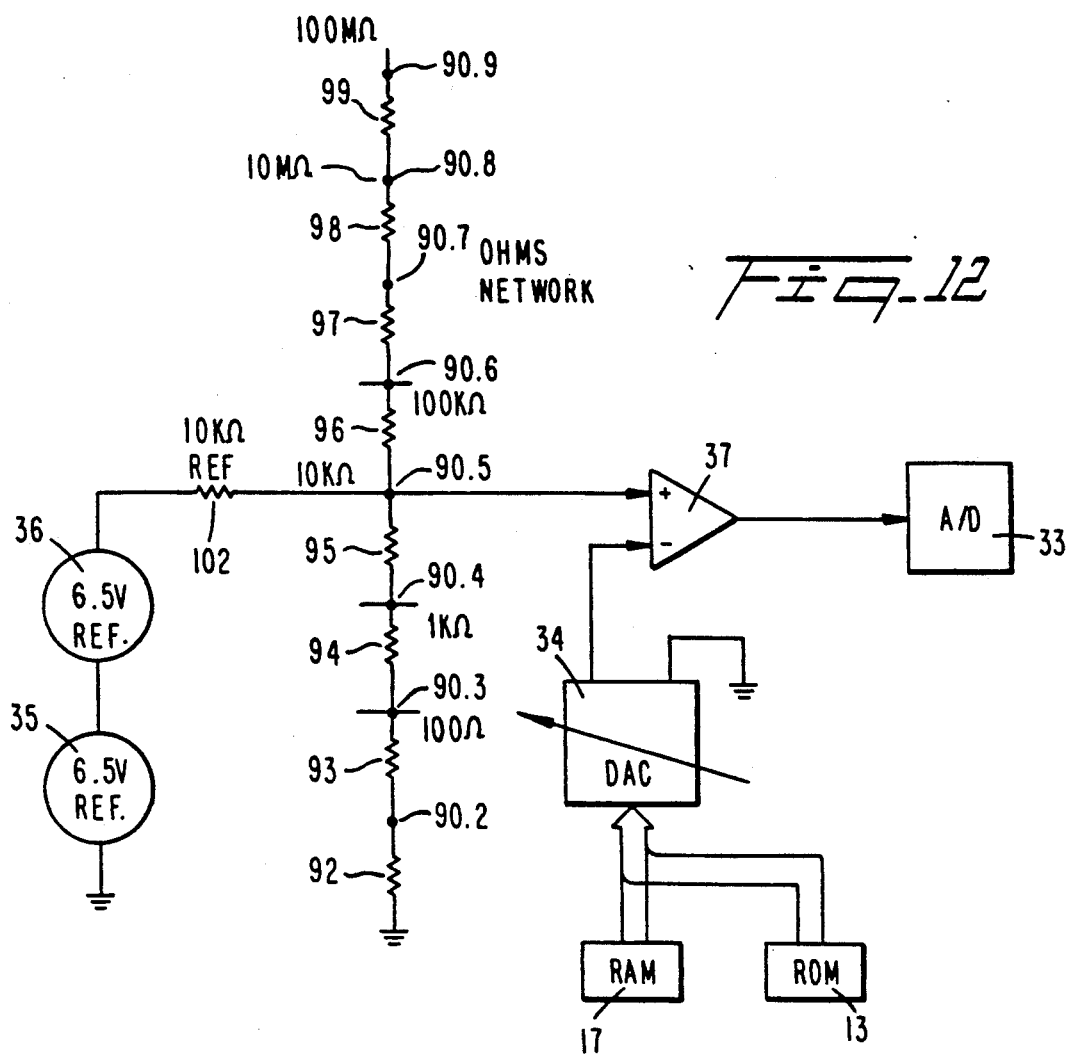
FIG. 12 is a block diagram of the apparatus illustrated in FIG. 1, when connected for internal calibration of resistors of a network used for calibrating the resistance, in ohms, of a meter.

After 10 kilohm resistor 102 has been calibrated, the resistors 91–99 for calibrating resistance in a meter, are Calibrated by connecting the apparatus through switch matrix 16 in the manner illustrated in FIG. 12. Resistors 92–99 in resistance chain 90 are arranged so that the resistances relative to round at each of taps 90.2–90.9 have values relative to ground of 10 ohms, 100 ohms, 1 kilohm, 10 kilohms, 100 kilohms, 1 megohm, 10 megohms and 100 megohms. The resistance at each of taps 90.2–90.9 is calibrated by connecting each tap to one terminal of 10 kilohm reference resistor 102, having a second terminal connected to the 13.0 DC volt reference derived by the series combination of reference sources 35 and 36.

The tap of resistance chain 90 that is connected to one terminal of resistor 102 is also connected to the non-inverting input of difference amplifier 37. The inverting input of amplifier 37 is responsive to an output signal of digital to analog converter 34, having a power supply input terminal responsive to the 13.0 DC volt level derived by the series combination of sources 35 and 36. DAC 34 is responsive to a digital output signal of ROM 13 commensurate with the nominal voltage at the tap of resistance chain 90 to which the non-inverting input terminal of amplifier 37 is connected. Hence, for each tap on resistance chain 90, RO 13 supplies a different input signal to DAC 34. Thereby, amplifier 37 derives a series of output voltages representing the calibration error for each tap of resistanCe chain 90. The resistance calibrating error representing signals derived from amplifier 37 are supplied to analog to digital converter 33, which in turn supplies a digital signal to RAM 17 at addresses designated for each resistance value at the several taps of resistance chain 90.

All of the foregoing connections are established by microprocessor 11 establishing a series of sequential address command signals to ROM 13. ROM 13 responds to each of the address command signals to supply a command signal to switch matrix 16 for each of taps 90.2–90.9. For each of taps 90.2–90.9, ROM 13 commands RAM 17 to write data from analog to digital converter 33 into a different address of RAM 17. Thereby, RA 17 stores at the designated addresses a digital signal representing the calibration error for each of the taps 90.2–90.9 of resistance chain 90.

To enable resistance chain 90 to calibrate resistance values between 10 ohms and 100 megohms of a meter being calibrated switch matrix 16 is controlled by ROM 13 in response to an operator activating switches in bank 115 so the calibrator output terminals are connected to each of taps 90.2–90.9. The resistances at the calibrator output terminals are coupled to resistance input terminals of a meter being calibrated via connections established by the operator. The visual display of the calibrator is connected via matrix 16 under the control of ROM 13 to outputs of RAM 17 representing the calibration errors at each of taps 90.2–90.9, as determined during the previously described internal calibration cycle for resistances 92–9 of the calibrator. The operator responds to the visual display to offset the resistance values displayed on the meter being calibrated so the meter derives accurate representations of resistance. Alternatively, if the meter includes a computer which can respond to calibration correction signals from the calibrator of the invention, the output signals of RAM 17 representing the resistance calibration correction errors at taps 90.2–90.9 are coupled to the meter and automatically offset the resistance values supplied by the calibrator to the meter.

Figure 13:
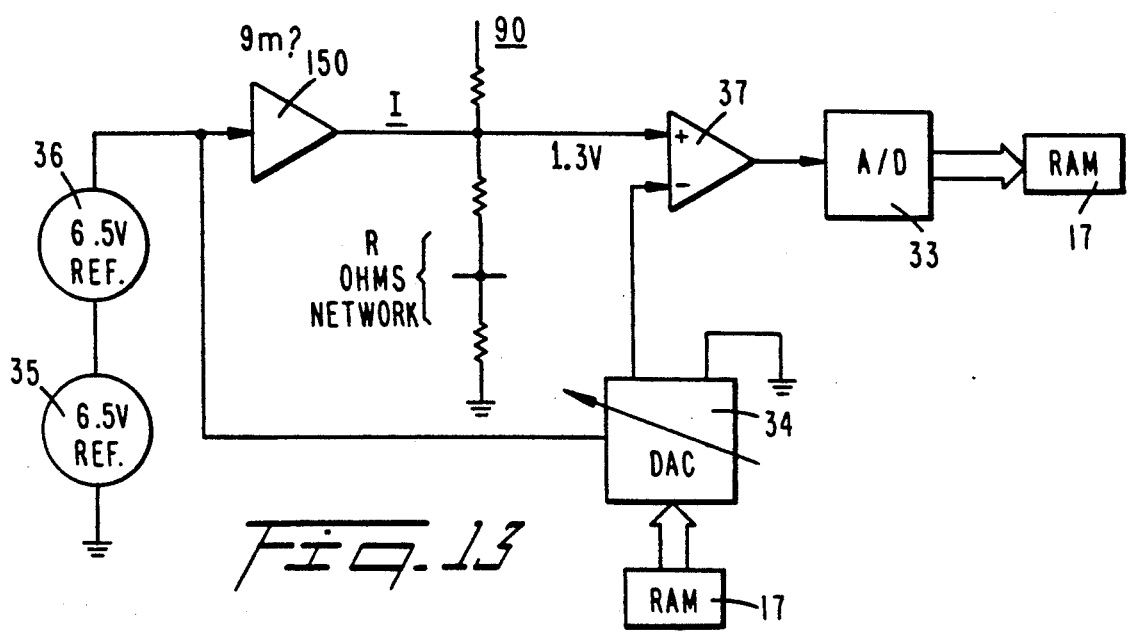
FIG. 13 is a block diagram of the apparatus illustrated in FIG. 1, when connected for internal calibration of calibrated currents supplied to a meter.

After the resistors of resistance chain 90 have been calibrated as described in connection with FIG. 12, microprocessor 11 steps ROM 13 to a condition which causes the connections illustrated in FIG. 13 to be established. The connections illustrated in FIG. 13 enable constant current generator 150 to be calibrated for each of the decade current ranges from 100 $\mu$a to 1 amp to provide calibrated currents that are order of magnitude multiples of 130 microamps. Current generator 150 is preferably of the type generally described in the book entitled *Integrated Electronics,* Millman and Halkias, page 539. To derive the different calibrated output currents, current generator 150 is selectively connected to resistors 151–155. To determine the calibration correction factor for each of the output currents of constant current generator 150, the output of the current generator is connected across the calibrated resistances 92–97 between taps 90.2–90.7 and ground in resistance chain 90. The resulting voltage drops across taps 90.2–90.9 are compared in difference amplifier 37 with outputs of DAC 34 representing the desired voltages across the taps, including the calibration errors of the resistors at taps 90.2–90.7 and the Components associated with the DAC to determine the calibration errors of constant current source 150 for each of 130 $\mu$a, 1.3 ma, 13 ma, 130 ma and 1.3 amperes.

To these ends, a first input terminal of constant current source 150 is connected to the series combination of sources 35 and 36 and a second input terminal of source 150 is sequentially connected to resistors 151–155. The connections are via switch matrix 16 under the control of ROM 13 while the ROM controls the matrix so the output of the current generator is connected across resistors 92–97. Simultaneously, the power supply terminal of DAC 34 is connected to the series combination of sources 35 and 36 and the input signal terminal of the DAC is responsive to binary signals from ROM 13 indicative of the nominal output voltages across taps 90.2–90.7 for each of the currents supplied by sourCe 150 to the resistors at taps 90.2–90.7. The values of resistors 151–156 are preferably selected so that the nominal voltages across taps 90.2–90.7 remain constant at 1.3 volts as current generator 150 is connected to different individual resistors 151–156 and to different ones of taps 90.2–90.7. Thus, DAC 34 is supplied by ROM 13 with the same signal while constant current source 150 is being calibrated for each current range.

The nominal outputs of DAC 34 are incremented and/or decremented in response to signals indicative of the calibration errors of reference sources 35 and 36, the resistances of resistors 92–97 and of the DAC itself, as derived from RAM 17. Difference amplifier 37 responds to the nominal voltages supplied to the non-inverting input thereof from taps 90.2–90.7 and the calibrated output voltages of DAC 34 to derive difference signals indicative of the calibration errors of current source 150 for each of resistors 151–156. The calibration errors for current generator 150, as derived from amplifier 37, are converted into digital signals by converter 33 and stored in RAM 17 at designated addresses under the control of ROM 13.

When an external measuring instrument is to be calibrated for current response, the operator closes switches in bank 117 whereby microprocessor addresses ROM 13 to activate matrix 16 so sources 35 and 36 are connected in a series with the first input of current generator 150 and resistors 151–156 are sequentially connected to the second input terminal of the current generator. The output of the current generator is connected to output terminals of the calibrator which are connected to current responsive input terminals of the meter being calibrated. The visual display of the calibrator is responsive to the current calibration correction signal stored in RAM 17 for each current value supplied to the Calibrator output terminals. The operator offsets the current value reading of the meter being calibrated by the indication on the visual display of the calibrator. Alternatively if the meter includes a computer it is connected by the operator to the RAM output terminals and the calibrated currents supplied by the calibrator to the meter are automatically offset.

Figure 11:
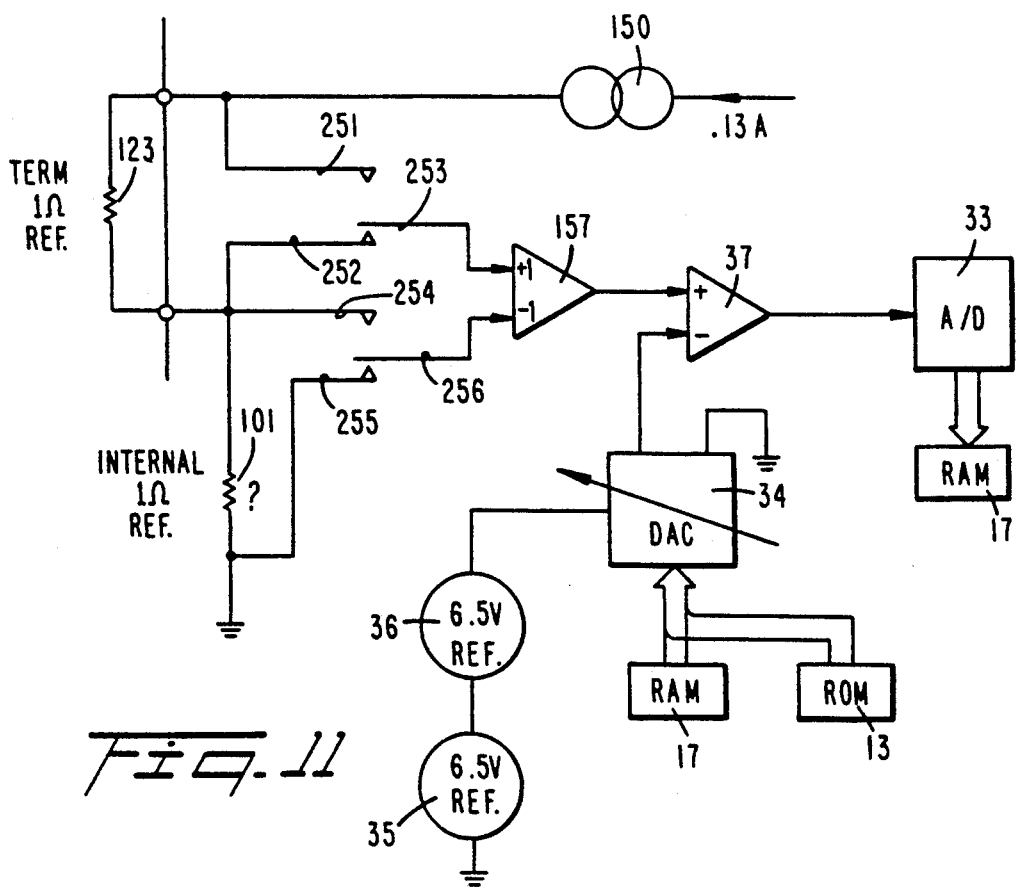

The 0.13 mere calibrated output of constant current source 150 is also used to establish the calibration correction factor for internal 1 ohm reference resistor 101 by activating switch matrix 16 to establish the connections illustrated in FIG. 11. To calibrate resistor 101, the calibrating instrument of the present invention is connected by the operator to four terminal 1 ohm external reference resistor 123, in turn connected to 0.13 amp constant current source 150. Resistors 101 and 123 are series connected with each other and to constant current source 150 so that there is nominally derived across each of the resistors a voltage of 0.13 volts. The responses cross resistors 101 and 123 are effectively compared to determine the calibration error of resistor 101 relative to that of four terminal external standard resistor 123.

To separately monitor the voltages across resistors 101 and 123, switch matrix 16 includes contacts 251–253 and 254–256, as illustrated in FIG. 11. Contacts 153 and 156 are connected to positive and negative input terminals of instrumentation amplifier 157; instrumentation amplifier 157 is not referenced to ground and thereby is able to respond to the voltage supplied to the positive and negative input terminals thereof to provide common mode rejection. Contacts 253 and 256 are effectively ganged contacts so that contacts 253 and 252 engage each other simultaneously with engagement of contacts 255 and 256; conversely, contacts 253 and 256 simultaneously engage contacts 251 and 254. Contacts 251 and 252 are connected to opposite terminals of four terminal resistor 123, while contacts 254 and 255 are connected to opposite terminals of resistor 101. To monitor the value of resistanCe 101, contacts 253 and 256 engage contacts 252 and 255 so that the opposite polarity input terminals of instrumentation amplifier 157 are responsive to the nominal 0.13 volt level developed across resistor 101. This voltage is compared with the voltage across resistor 123 when Contacts 253 and 256 are engaged with contacts 251 and 254.

The responses derived by amplifier 157 are supplied to the non-inverting input terminal of amplifier 37, having an inverting input responsive to the output of DAC 34. DAC 34 supplies the inverting input terminal of amplifier 37 with an analog voltage representing the calibration errors of constant current source 150 for the 0.13 ampere range, the DAC itself, and reference sources 35 and 36, which are series connected to the DAC power supply terminal.

When contacts 251, 253 and 254 and 256 are connected the output signal of amplifier 37 is a voltage representing the response of four terminal external reference resistor 123 to current source 150, with compensation for the calibration errors of source 150 for the 0.13 ampere range and the components associated with DAC 34. The output signal of amplifier 37 is supplied to analog to digital converter 33 which derives a digital signal that is stored in a designated address of RAM 17. Thereafter, contacts 252, 253, and 255, 256 are connected, whereby converter 33 supplies another designated address in RAM 17 with a digital signal representing the resistance of resistor 101, with calibration corrections for source 150 in the 0.13 ampere range and the components associated with DAC 34. The addresses in RAM 17 where the responses for resistors 101 and 123 are stored are accessed by microprocessor 11 which differentially combines them to derive an indication of the calibration error for resistor 101. This calibration error is stored in a designated address in RAM 17.

Resistor 101 is used to supply a response to output terminals of the calibrator when it is desired to calibrate an external measuring instrument in the 1 ohm range. The procedure is the same as that described supra for calibrating resistances of 10 ohms to 100 megohms except that resistor 101 is connected directly to the input terminal of the meter being calibrated via connections established by switch matrix 16 in response to the output of ROM 13 under the control of a signal from microprocessor 11, as controlled in response to closure of the switch in bank 115 associated with 1 ohm.

Figure 14:
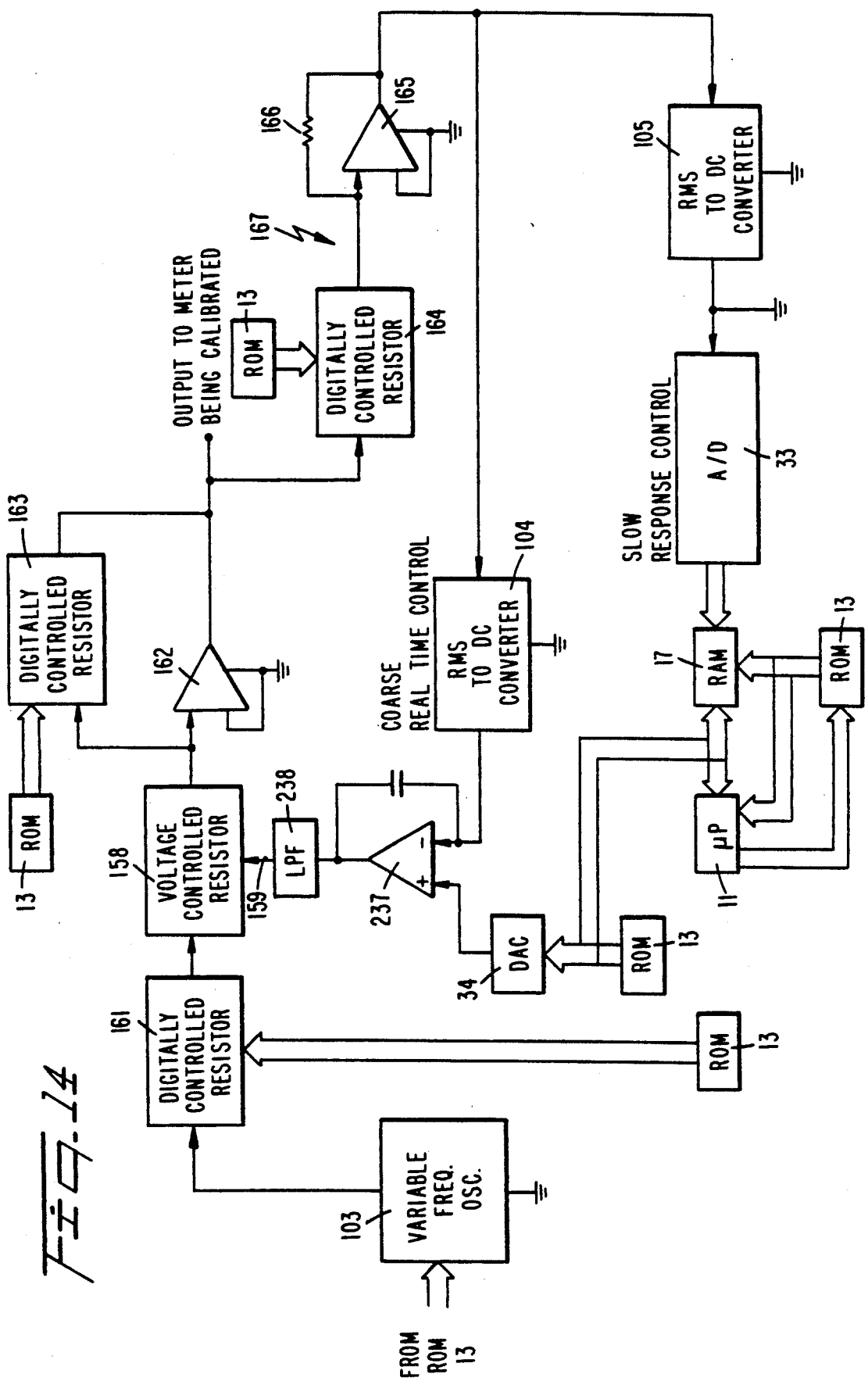
FIG. 14 is a block diagram of the apparatus illustrated in FIG. 1, when connected to supply calibrating AC voltages to a meter being calibrated.

To enable AC calibrating voltages to be supplied by the calibrator of the present invention to an external meter being calibrated, switch matrix 16 is energized to establish the connections illustrated in the circuit diagram of FIG. 14. The external calibrated meter responds to an AC voltage having a wide frequency range, between 40 hertz and one megahertz, and a wide range of amplitudes, as derived from amplifier 162, in turn responsive to the output of variable frequency, fixed amplitude oscillator 103. The frequency of oscillator 103 is controlled by the output of ROM 13 in response to the operator closing one of the switches in switch bank 118.

The variable frequency of oscillator 103 is changed in amplitude by the circuit including amplifier 162 and the impedances associated therewith, namely digitally controlled resistors 161 and 163, as well as voltage controlled resistor 158. Resistors 158 and 161 are connected in series with each other between the output of oscillator 103 and the input of amplifier 162, while resistor 163 is connected in a feedback path between the input and output terminals of amplifier 162. The values of resistors 161 and 163 are Controlled in response to the output of ROM 13 to control the range of the output of amplifier 162 and the amplitude of the output in the range to predetermined, nominal values. In addition, resistor 158 is responsive to calibrating correction error signals, as coupled to DAC 34 by RAM 17 for the AC output in each amplitude and frequency range. RAM 17 is addressed by outputs of ROM 13 designated for the calibration correction errors, which are derived in a manner described infra in connection with FIGS. 15 and 16. If oscillator 103 is set to derive a frequenCy between the frequencies for which it has been calibrated, the calibration errors for the two adjacent calibrated frequencies are supplied by RAM 17 to microprocessor 11. microprocessor 11 interpolates between the calibration errors for the two adjacent frequencies to determine the calibration error for the set frequency. The calibration error for the set frequency is coupled to RAM 17 for control of resistor 158 via DAC 34.

RAM 17 also supplies digital control signals to resistor 161 to provide a precise, relatively long term feedback control for the output of amplifier 162; in the preferred embodiment, the feedback loop including RAM 17 and resistor 161 maintains the output of amplifier 162 to 10 parts per million. A coarse (0.1%), real time feedback path is also provided &o voltage controlled resistor 158. Hence, two basically parallel feedback loops are provided, one being a relatively coarse, real time loop and the second being a precise, relatively long time constant loop.

The output voltage of amplifier 162 has a tendency to decrease as the frequency of oscillator 103 increases because of distributed, i.e., stray, capacitances of the control circuit. The long time constant, precise loop includes compensation for the reduced output voltage of amplifier 162 as the frequency of oscillator 103 is increased. The effect of the distributed capacitances and the amount of required compensation is determined during the calibration procedure and stored in RAM 17 to control the value of resistor 158 while the output of amplifier 162 is being coupled as a calibrating voltage to an external meter. Thereby as the frequency of oscillator 103 changes, the value of resistor 158 is accordingly changed so the AC output of amplifier 162 supplied to the external meter is maintained at the desired value.

The real time, coarse feedback loop includes RS AC to DC converter 104, while the relatively long time constant, precise control feedback loop includes RS-AC to DC Converter 105. Converters 104 and 105 are driven in parallel by the output of attenuator 167, including amplifier 165 having an input terminal connected to the output of amplifier 162 by digitally controlled resistor 164; fixed resistor 166 is connected s a feedback impedance between the input and output terminals of amplifier 165. The value of resistor 164 is controlled by the output of ROM 13 in a manner similar to the control provided by the ROM for resistor 163. Thereby, the attenuation factor of amplifier 165 and the main factor of amplifier 162 are approximately the same, so that the output of amplifier 165 stays in a range which can be handled by converters 104 and 105 regardless of the amplitude of the voltage applied by amplifier 162 to the external device being calibrated.

The AC output of amplifier 165 is applied to RMS to DC converter 104 which derives a DC output signal having a magnitude indicative of the actual RMS output of amplifier 165. For each of the settings of digitally controlled resistors 161, 163 and 164 and for each of the frequencies of oscillator 103, converter 104 should derive a predetermined DC output voltage. The output voltage of converter 104 is compared with a preset value for the output thereof stored in a designated address in ROM 13. The value stored in the designated address of ROM 13 is determined by the frequency of oscillator 103, as well as the values of resistors 161, 163 and 164. The signal in ROM 13 at the address is supplied to DAC 34 where it is modified by the calibration correction error supplied to the DAC by RAM 17. The DC output signals of DAC 34 and converter 104 are respectively applied to the non-inverting and inverting input terminals of integrator 237 which derives an analog error signal having a magnitude and polarity that controls the value of voltage controlled resistor 158 to maintain, on a real time basis, the output voltage of amplifier 162 to approximately the desired level indicated by the output of DAC 34. To prevent ripple in the output of integrator 237 affecting the feedback loop, the output of integrator 237 is applied to low pass filter 238, thence &o a control input terminal of resistor 158.

The precise long time constant control of the output of amplifier 162 is provided by supplying the output of RMS to DC converter 105 to the input of analog-to-digital converter 33. Converter 33 thereby derives a multibit digital signal which is coupled to a designated address in RAM 17 under the control of an address output signal of ROM 13. The signal in RAM 17 representing the magnitude of the output of converter 105 is compared in microprocessor 11 with a digital signal stored in ROM 13 indicative of a desired preset value for the output of converter 105 for the range designated by the values of resistors 163 and 164 and the value within the range, as indicated by the value of resistor 161. Microprocessor 11 responds to the digital signals representing the preset and actual values for the output of converter 105 to derive a digital error signal that is coupled back to a designated address in RAM 17, under the control of ROM 13.

The error representing digital signal for the output of converter 105 stored in RAg 17 is periodically read out of the RAM into an accumulator register in resistor 161 to increment and decrement the value of resistor 161. The value stored in the accumulator register in resistor 161 indicates the amplitude of the AC output of amplifier 162 within the range designated by the values of resistors 163 and 164, as supplied to the register by ROM 13.

Reference is now made to FIG. 15 of the drawing wherein the connections established by switch matrix 16 under the control of ROM 13 for low frequency calibration of the apparatus illustrated in FIG. 14 are indicated. For low frequencies of oscillator 103, i.e., frequencies less than 100 Hz., it can be validly assumed that the stray capacitances of the circuit used to derive the calibrating output voltage of amplifier 162 do not have an effect on the output of amplifier 162 applied to the meter being calibrated. Thereby, DC voltages are used to calibrate the low frequency responses of Converter 104, amplifier 162, attenuator 167 and the circuitry associated therewith.

The first step in the low frequency calibration involves determining the calibration correction error for converter 104, an operation performed by activating switch matrix 16 so that 6.5 volt DC reference source 35 is connected through switch contacts 181, 182 (included in matrix 16) to the input of the converter. The output of converter 104 and the 6.5 volt output of source 35 are respectively applied to the non-inverting and inverting terminals of amplifier 37, which derives an error signal representing the calibration correction error of converter 104; the connection from source 35 to amplifier 37 is via switch contacts 184 and 185 (included in matrix 16). The DC output of amplifier 37 is applied to analog-to-digital converter 33, which derives a digital signal that is stored in an appropriate location in RAg 17 under the control of ROM 13.

After the calibration correction error for converter 104 has been determined, the DC offset introduced by amplifiers 162 and 165 is determined by ROM 13 supplying a digital control signal to DAC 34 representing a zero voltage level and by activating matrix 16 so the output of the DAC is connected to resistor 161, in turn connected to the signal input terminal of amplifier 162. Matrix 16 is activated so the resulting DC output of amplifier 162 is coupled through resistor 164 to the signal input terminal of amplifier 165, the output of which is coupled through switch contacts 181 and 183 (included in matrix 16) to the input of RMS-AC to DC converter 104. The output of converter 104 is compared with a zero volt level by coupling the output of the converter to the non-inverting input terminal of amplifier 37 while the inverting input of the amplifier is connected to ground through contacts 184 and 186 (included in matrix 16). The resulting difference output of amplifier 37, representing the DC zero offset of amplifiers 162 and 165, is converted into a digital signal by converter 33 that supplies a designated address in RAM 17 with the zero offset factor.

Then switch matrix 16 is activated to determine the low frequency calibration errors for the circuit including amplifiers 162 and 165. In particular, the circuit illustrated in FIG. 15 is established so contacts 181, 183 and 184, 185 engage. The values of resistors 161, 163 and 164, as well as the amplitude of the output of DAC 34, are controlled by digital signals in ROM 13 so that as the range of the DC output of amplifier 162 changes, the DC voltage applied to converter 104 by amplifier 165 has a nominal value of 6.5 volts converter 104 responds to the nominal 6.5 volt input level supplied to it to derive a DC output voltage having the same value as the input voltage to the converter. The output of converter 104 is compared with the 6.5 volt reference of source 35 in amplifier 37 which derives a low frequency calibration error signal for each amplitude to be applied by amplifier 162 to a meter which is later calibrated. The low frequency calibration error signals are derived in response to changes in the values of resistors 161, 163 and 164.

The low frequency calibration error signals derived from amplifier 37 are converted into digital signals by converter 33, having an output which supplies designated addresses in RAM 17 with digital signals indicative of the low frequency calibration errors. The low frequency calibration error signals stored in RAM 17 are combined with the zero offset and converter 105 calibration error signals stored in the RAM by microprocessor 11 activating ROM 13 to read the low frequency calibration error signal, zero offset signal, and converter 105 calibration error signals in the RAM into microprocessor 11. Microprocessor 11 combines the zero offset and converter 105 calibration error signals with each of the low frequency calibration error signals to derive a more accurate low frequency calibration error signal for each amplitude supplied by amplifier 162 to an external meter. The more accurate low frequency calibration error signals derived by microprocessor 11 are coupled back to designated addresses in RAM 17 under the control of ROM 13.

When oscillator 103 is activated to supply a low frequency calibrating signal to a meter being calibrated, RAM 17 is addressed by ROM 13 to supply calibration correction signals to voltage controlled resistor 158 via DAC 34. For each amplitude supplied by amplifier 162 to the meter being calibrated, RAM 17 is stepped by ROM 13 to a different address so that the value of resistor 158 due to the low frequency calibration error is subject to being different. The calibration error signals increment and decrement preset in range values for resistor 158 supplied to DAC 34 by ROM 13.

To determine the high frequency calibration errors, switch matrix 16 is activated to establish the connections illustrated by the circuit diagram of FIG. 16. For high frequency calibration, i.e., frequencies between 100 Hz and 1 MHz, oscillator 103 is activated by ROM 13 to derive frequencies of 10 Hz, 100 Hz, 1 KHz, 10 KHz, 100 KHz and 1 MHz. In actual operation virtually every frequency in this range can be supplied by the calibrator of the invention to the external meters to be calibrated by using an interpolation process in microprocessor 11 of the calibration errors stored in RAM 17.

The calibration correction error is determined for one amplitude at each frequency position of oscillator 103. From the determined calibration error at the single amplitude for each frequency, the calibration correction is determined by microprocessor 11 for all amplitudes at that frequency in response to the low frequency calibration errors previously detected and stored. This procedure requires less time than stepping the amplitude derived from amplifier 162 through each amplitude step at each frequency position. It is to be understood, however, that if desired or necessary the amplitude of the output of amplifier 162 can be varied through several steps at each frequency position of oscillator 103.

To provide the high frequency calibration, switch matrix 16 is energized so the output of oscillator 103 is connected to the input of amplifier 162 via the series combination of voltage controlled resistor 158 and digitally controlled resistor 161. The output of amplifier 162 is coupled to the same coarse feedback loop for resistor 158 as described supra in connection with FIG. 14. However, during the high frequency calibration, no calibration correction errors are supplied by RAM 17 to DAC 34 and the DAC is responsive only to predetermined set point values from ROM 13.

The precise, long time constant feedback loop for resistor 161 is broken and the output of amplifier 162 is coupled to the input of AC-RMS to DC converter 105 via digitally controlled resistor 106, the value of which is controlled by ROM 13 so that the input to converter 105 has approximately the same amplitude as the input to converter 104. As described supra resistor 106 includes plural precise resistors that have virtually no reactance components so that the input to converter 105 does not change as a function of the frequency of oscillator 103. However, the input to converter 104 is a function of frequency because of the stray reactances of resistor 164 at the input of amplifier 165 in attenuator 167. Because of the stray reactances, the value of resistor 158 is not properly controlled by the feedback loop including converter 104. The circuitry responsive to the output of amplifier 162 including converter 105 determines the change in the amplitude of the output of amplifier 162 due to the reactances of the path including converter 104.

To these ends, the DC output of converter 105 is compared with the 6.5 volt reference voltage of source 35 by applying the converter and source voltages to the inverting and non-inverting input terminals of difference amplifier 37. Difference amplifier 37 thereby derives an analog output signal representing the calibration correction error for a single amplitude of oscillator 103 for each frequency of the oscillator. Preferably, the single amplitude represents a median value in the gamut of amplitudes applied by oscillator 103 via amplifier 162 to the terminals which are ultimately connected to the meters to be calibrated. To these ends, ROM 13 supplies predetermined signals to resistors 161, 163 and 164, as well as to resistor 106, to maintain the inputs to converters 104 and 105 at the proper value during the high frequency calibration operation.

The high frequency calibration analog output signal of difference amplifier 37 is converted into a digital signal by analog-to-digital converter 33, which supplies digital signals indicative thereof to designated addresses in RAM 17 under the control of ROM 13. The high frequency signals stored in RAM 17 are combined in microprocessor 11 with the signals stored in the RAM for each of the low frequency amplitude calibration errors. Microprocessor 11 responds to the low and high frequency error calibration signals to derive a separate calibration error correction signal for each amplitude and frequency position of oscillator 103. During normal operation when amplifier 162 is connected to an external meter being calibrated, the calibration error signals for each amplitude and frequency position stored in RAM 17 are supplied to voltage controlled resistor 158 via DAC 34.

While there has been described and illustrated one specific embodiment of the invention, it will be clear that variations in the details of the embodiment specifically illustrated and described may be made without departing from the true spirit and scope of the invention as defined in the appended claims.

I claim:

1. A calibrated source for supplying a calibrated electric parameter over plural ranges to a device to be calibrated comprising internal components for deriving the parameter over the plural ranges, an internal voltage reference, digital-to-analog converter means, a memory, analog comparison means, and analog-to-digital converter means, first means for connecting the internal components in circuit with the internal voltage reference, analog-to-digital converter means, comparison means and memory for writing data signals into the memory indicative of calibration correction factors for the internal components as applicable to the internal components, and second means for connecting the internal components in circuit with the memory and digital-to-analog converter means so the digital-to-analog converter means responds to the stored data signals indicative of the calibration correction factors to modify the value of the parameter supplied to the device by the internal components so the supplied parameter is corrected in accordance with the calibration correction for the parameter.

2. The source of claim 1 wherein the parameter is voltage to be derived over plural ranges, the internal components being variable voltage changing means, the first connecting means including means for connecting: (a) the voltage changing means to the internal voltage reference means so that different voltages applicable to the plural ranges are derived at different times, (b) the voltages derived by the voltage changing means and an analog output signal of the digital-to-analog converter means, as corrected for calibration correction factors of the converter means and the internal reference by a stored signal from the memory to the comparison means so the comparison derives an error signal, (c) the comparison means to the analog-to-digital converter means so the analog-to-digital converter means derives a signal indicative of the error, and (d) the converter means to the memory so the memory stores a digital signal representing a correction factor for each range, determined by the error indicating signal.

3. The source of claim 2 wherein the variable voltage changing means includes voltage divider means having different voltage division factors.

4. The source of claim 3 wherein the variable voltage changing means includes amplifier means having different gain factors.

5. The source of claim 2 wherein the variable voltage changing means includes amplifier means having different gain factors.

6. The source of claim 2 wherein the voltage to be measured is DC and the internal voltage reference means is a DC source, and the first connecting means includes means for coupling a DC voltage from the DC source to the comparison means.

7. A calibrated source for supplying a calibrated electric parameter over plural ranges to a device to be calibrated comprising internal components for deriving the parameter over the plural ranges, an internal voltage reference, digital-to-analog converter means, a memory, analog comparison means, and analog-to-digital converter means, first means for connecting the internal components in circuit with the internal voltage reference, digital-to-analog converter means, analog-to-digital converter means, comparison means and memory for writing data signals into the memory indicative of calibration correction factors for the internal components, second means for connecting the internal components in circuit with the device to be calibrated, and means for activating the memory to read out the stored data signals indicative of the calibration correction factors while the second means connects the internal components with the device to be calibrated to enable the value of the parameter supplied to the device by the internal components to be modified to enable the supplied parameter to be corrected in accordance with the calibration correction factors for the internal components as applicable to the parameter.

8. The source of claim 7 wherein the parameter is an impedance to be coupled to the external device over plural ranges, the internal components including a reference impedance having a reference value and impedance means having different values for each of the ranges, the first connecting means including means for connecting: (a) the internal voltage reference means in circuit with the reference impedance and the impedance means to derive a first analog signal having a magnitude indicative of a reference value for the impedance means in one of the impedance ranges, a different magnitude being derived for each of the impedance ranges, (b) the digital-to-analog converter means to the memory to derive a second analog signal, (c) the first and second analog signals to the comparison means so that the comparison means derives an analog error signal, (d) the comparison means to the analog-to-digital converter means so the analog-to-digital converter means derives a digital signal indicative of the error, and (e) the memory to the analog-to-digital converter means so the memory stores a digital signal representing an impedance calibration correction factor for each range, determined by the error indicating signal.

9. The source of claim 7 wherein the parameter is a current to be measured over plural ranges, the internal components including a constant current generator for deriving a different current for each of the ranges and impedance means having different values for each of the ranges, the first connecting means including means for connecting: (a) the internal voltage reference means in circuit with the constant current generator and the impedance means to derive a first analog signal having a magnitude indicative of a reference value for the current in each of the current ranges, a different magnitude being derived for each of the current ranges, (b) the digital-to-analog converter means to the memory to derive a second analog signal, (c) the first and second analog signals to the comparison means so that the comparison means derives an analog error signal, (d) the comparison means to the analog-to-digital converter means so the analog-to-digital converter means derives a digital signal indicative of the error, and (e) the memory to the analog-to-digital converter means so the memory stores a digital signal representing a current calibration correction factor for each range, determined by the error indicating signal.

10. A method of calibrating an electric measuring instrument for an electric parameter in each of several ranges, the calibration being performed with an instrument including: internal components associated with measuring the parameter over the plural ranges, an internal voltage reference, digital-to-analog converter means, a memory and analog comparison means, the method comprising;

simultaneously connecting: (a) an external reference voltage source to the comparator, (b) the internal voltage reference source as a power supply to the converter means while the converter means responds to a digital signal representing the magnitude of the external reference voltage so the converter means derives a first analog signal having a value equal to the magnitude of the external voltage reference as modified by inaccuracies of the internal reference and the converter means and (c) the converter means to the comparator so the comparator derives an output signal indicative of a first error between the first analog signal and the external voltage reference, in response to the first error, storing an indication of inaccuracies of the internal reference and the converter means, then calibrating the internal components by simultaneously connecting: the internal reference supply to power the internal components and the converter means while the converter means responds to a series of stored digital signals representing the values of responses from the converter means for different configurations of the internal components, the converter responding to the series of digital signals to derive a series of analog signals having values adjusted by the first error so they are equal to calibrated values for analog signals derived by the internal components, connecting the converter means and the internal components to the comparator while the components are in the different configurations and the converter is deriving the series of analog signals so the comparator derives a series of error signals representing the errors between the series of analog signals and further signals derived from the internal components while they are in the different configurations, storing the error signals representing the magnitudes of the errors between the series of analog signals and the further signals to represent calibration correction factors for each of the different configurations, connecting the internal components to the instrument being calibrated so the instrument being calibrated is responsive to a series of analog signals, one for each of the ranges, while the instrument is responsive to the series of analog signals, reading out the calibration correction factor associated with the analog signal being supplied to the instrument by the memory, and modifying the input to the instrument to account for the read-out calibration correction factor.

11. Method of deriving calibrating voltage and/or current and/or resistance parameters over multiple ranges for calibrating voltage and/or current and/or resistance responses of instruments over multiple ranges, the calibrating parameters being derived with a calibrator having: (a) input terminals responsive to an external standard source of at least one of said parameters having a precise value, (b) switch means, (c) a DC reference voltage source, (d) digital-to-analog converter means, (e) a DC comparator, (f) an analog-to-digital converter, (g) memory means, and (h) circuit means for deriving calibrating output signals over multiple ranges for at least one of said parameters; the method comprising:

(A) from time to time connecting an external DC voltage standard having a precise magnitude to said input terminals while activating said switch means to connect simultaneously (a) one of said input terminals to an input of said comparator, (b) said DC reference source and a signal from said memory means as inputs to said digital-to-analog converter means, a digital output indicative of said magnitude of the DC reference source and the signal from the memory means causing the digital-to-analog converter means to derive a DC signal nominally having a predetermined magnitude relative to the magnitude of the voltage standard, (c) said digital-to-analog converter means to an input of said comparator, (d) an output of said comparator indicative of the magnitude of the deviation of said inputs thereof to said analog-to-digital converter means, and (e) an output of said analog-to-digital converter means to said memory means; the output of the analog-to-digital converter means supplied to said memory means being indicative of a calibrating error of the digital-to-analog converter means while supplied with the voltage of the DC reference voltage source;

(B) from time to time, after step A has been performed at least once, activating said switch means to connect simultaneously (a) said DC reference source to an input of said comparator, (b) said DC reference source and a signal from said memory means as inputs to said digital-to-analog converter means, a digital output indicative of said magnitude of the DC reference source and the signal from the memory means causing the digital-to-analog converter means to derive a DC signal nominally having a predetermined magnitude relative to the magnitude of the DC reference source, the memory also supplying to the digital-to-analog converter means with a signal indicative of the calibrating error derived during step A, (c) said digital-to-analog converter means to an input of said comparator, (d) an output of said comparator indicative of the magnitude of the deviation of said input thereof to said analog-to-digital converter means, and (e) an output of said analog-to-digital converter means to said memory means; the output of the analog-to-digital converter means supplied to said memory means being indicative of a calibrating error of the DC reference source;

(C) from time to time, after step B has been performed at least once, activating the switch means to connect simultaneously (a) said DC reference source and said memory means as inputs to said digital-to-analog converter means, and (b) said DC reference source, said comparator, said digital-to-analog converter means output and said circuit means to each other while the digital-to-analog converter means responds to calibrating error signals derived during steps A and B so that the comparator derives a signal indicative of a calibrating error for the circuit means; and (D) from time to time, after step C has been performed at least once, deriving a sequence of at least one of said calibrating parameters by: (i) activating the switch means to connect simultaneously (a) said DC reference source and said memory means to inputs of said digital-to-analog converter means, (b) the output of said digital-to-analog converter means to said circuit means, and (ii) with the connection of (i) established and the digital-to-analog converter means being responsive to the calibrating errors derived during steps (A) and (C), activating the memory means to supply signals representing a gamut of values of the at least one parameter of the digital-to-analog converter means so that the circuit means derives a gamut of analog values, one for each range, of the at least one parameter, each of the analog values in the gamut being calibrated for errors derived during steps A and C are suitable for calibrating the instrument.

12. The method of claim 11 wherein the parameter is resistance and further comprising from time to time after step A has been performed connecting a precise external four terminal resistor to said input terminals while activating the switch means to connect (a) an internal resistor having about the same value as the external resistance in circuit with the input terminals, and (b) a terminal between said resistor and an output of the digital-to-analog converter means to said comparator while said resistors are energized by a source inside of the calibrator and said digital-to-analog converter means is supplied by the memory with a signal indicative of the calibration error of the DC reference voltage source so that the comparator derives a signal having a magnitude indicative of a calibration error for the internal resistor.

13. The method of claim 12 wherein the internal and external resistors have values much greater than one ohm, said switch means being activated to connect: (a) the DC reference voltage across said resistors, and (b) the memory to the digital-to-analog converter means so that the digital-to-analog converter means is supplied with signals indicative of the value of the expected voltage drop across said internal resistor and the calibration error of the DC reference voltage and the digital-to-analog converter so that the comparator derives a signal having a magnitude representing the calibration error of the internal resistor.

14. The method of claim 13 wherein the internal and external resistors have values on the order of one ohm, the circuit means including a constant current generator adapted to be powered by the DC voltage reference source, said switch means being activated to connect (a) the constant current generator to be powered by the DC voltage reference source so the generator derives a predetermined current magnitude, (b) the resistors to be responsive to the predetermined current magnitude derived by the constant current generator, and (c) the memory to the digital-to-analog converter means so that the digital-to-analog converter means is supplied with signals indicative of the value of the expected voltage drop across said internal resistor and the calibration error of the DC reference voltage and the digital-to-analog converter so that the comparator derives a signal having a magnitude representing the calibration error of the internal resistor.

15. The method of claim 14 wherein the circuit means includes an instrument amplifier having: complementary first and second input terminals and a switch having: (a) first and second armatures respectively connected to said first and second input terminals, and (b) contacts connected to one terminal of the internal resistor, one terminal of the external resistor and a common terminal for the internal and external resistors, activating said switch means to connect an output of said instrument amplifier to an input of the comparator while the comparator is responsive to an output of the digital-to-analog converter means while the digital-to-analog converter means is supplied by the memory with a signal indicative of the calibration error of the DC reference source; with the switch means so activated, activating said switch so that during a first interval: the first and second terminals of the instrument amplifier are respectively connected to said one terminal of the internal resistor and the common terminal; and during a second interval: the first and second terminals of the instrument amplifier are respectively connected to the common terminal and said one terminal of the external resistor; the switch means being activated so that signals having values representing the magnitudes of the comparator output during the first and second intervals are supplied to first and second locations in the memory in response to outputs of the analog-to-digital converter means;

16. The method of claim 11 wherein the parameters and responses are voltage, the circuit means including voltage divider means, step C comprising activating the switch means to connect the voltage divider means in circuit with the DC reference source, the comparator, the digital-to-analog converter means, the analog-to-digital converter means and the memory so that the comparator derives analog signal having a magnitude indicative of the calibration error of the voltage divider means and the analog-to-digital converter means supplies the memory with a signal indicative of the voltage divider calibration error, and step D comprising activating the switch means so the voltage divider means is connected to be responsive to the gamut of analog signals derived from the digital-to-analog converter means while the digital-to-analog converter means is responsive to the signal in the memory indicative of the calibration error of the voltage divider means.

17. The method of claim 16 wherein the parameter is resistance, determining the calibration error of an internal reference resistor by connecting the internal reference resistor in circuit with an external calibrated resistor connected to said input terminals, storing the determined calibration error in the memory, and then activating the switch means to connect simultaneously (a) the internal reference resistor in circuit with the DC reference voltage sand resistors of a chain of resistors to be calibrated, (b) a tap on the resistor chain and the analog output of the digital-to-analog converter means to the comparator, and (c) the memory to the digital-to-analog converter means while the memory is supplying the digital-to-analog converter means with a calibration correction signal for the internal resistor and signals representing nominal voltage drops for resistors in the chain so that the comparator derives signals having magnitudes indicative of calibration errors of resistors in the chain.

18. The method of claim 16 wherein the parameter is resistance, storing a determined calibration error for an internal reference resistor in the memory, and then activating the switch means to connect simultaneously (a) the internal reference resistor in circuit with the DC reference voltage and a resistor to be calibrated, (b) the voltage across the resistor to be calibrated and the analog output of the digital-to-analog converter means to the comparator, and (c) the memory to the digital-to-analog converter means while the memory is supplying the digital-to-analog conveter means with a calibration correction signal for the internal resistor and a signal representing the nominal voltage drop across the resistor to be calibrated so that the comparator derives a signal having a magnitude indicative of the calibration error of the resistor to be calibrated.

19. The method of claim 16 wherein the parameter is current, the circuit means including a constant current source and a resistor having a predetermined value and a determined calibration error stored in the memory, activating the switch means to connect simultaneously: a constant current derived by the constant current source to said resistor (b) the voltage developed across the resistor and the output of the digital-to-analog converter means to said comparator and (c) the memory to the digital-to-analog converter means so that the digital-to-analog converter means is supplied with stored signals indicative of the nominal voltage across the resistor and the calibration error of the resistor, whereby the comparator derives a signal having a magnitude representing the calibration correction error for the constant current generator.

20. The method of claim 19 wherein step D of claim 16 is performed by connecting resistors having different values and determined calibration errors to the output terminal of the constant current generator as the constant current generator is adjusted to derive currents having differing nominal values.

21. The method of claim 16 wherein the voltage divider means includes a resistive voltage divider having a tap, the switch means being activated so the voltage divider means is connected across the reference source and the tap is connected to an input of the comparator.

22. The method of claim 21 wherein the voltage divider means includes a further resistive voltage divider having a tap, the tap of the further resistive voltage divider having a greater voltage division factor than the first named tap, the switch means being activated so the further voltage divider means is connected across the reference source and the tap of the further resistive voltage divider is connected to an input of the comparator.

23. The method of claim 22 wherein the voltage divider means includes a power amplifier and the reference source includes a tap, the switch means being activated to connect (a) an input of the power amplifier to the tap of the reference source, and (b) opposite terminals of the further voltage divider across outputs of the power amplifier and the digital-to-analog converter means, the tap of the further resistive voltage divider to an input of the comparator while the digital-to-analog converter means is responsive to a signal from the memory indicative of a calibrating error of the further resistive voltage divider so that the comparator derives a signal determined by the calibrating error of the power amplifier.

24. The method of claim 23 wherein the voltage divider means includes an additional resistive voltage divider having a tap having a voltage division factor much greater than that of the further voltage divider, the switch means being activated so (a) inputs and outputs of the power amplifier are respectively connected to the reference source and the additional divider, and (b) the comparator is responsive to the voltage at the tap of the additional voltage divider and the output of the digital-to-analog converter means while the digital-to-analog converter means is responsive to a stored signal in the memory indicative of the power amplifier calibration error.

25. The method of claim 21 wherein the voltage divider means includes an amplifier, the switch means being activated to connect (a) the resistive voltage divider to be responsive to an output of the digital-to-analog converter means, (b) an input of the amplifier to be responsive to the voltage at the tap, and (c) the comparator to be responsive to the reference voltage and an output of the amplifier so that the comparator derives a signal determined by the calibration error of the amplifier; step D comprising activating the switch means to the resistive voltage divider is cascaded with the amplifier so the resistive voltage divider and the amplifier are connected to be responsive to the gamut of analog signals derived from the digital-to-analog converter means while the converter means is responsive to the signal in the memory indicative of the calibration errors of the resistive voltage divider and the amplifier.

26. The method of claim 25 wherein the voltage divider means includes another resistive voltage divider having a tap with a greater voltage division factor than the first named resistive voltage divider, the reference source including a tap, the connecting means being activated so (a) the another resistive voltage divider is connected across the tap of the reference source, (b) the tap of the another resistive voltage divider is connected to an input of said amplifier, and (c) said comparator is responsive to output signals of said amplifier and said digital-to-analog converter means to derive an analog signal having a magnitude indicative of the calibration correction error for the another resistive voltage divider, whereby said calibration correction error for the another resistive voltage divider is stored in the memory; and step D comprising activating the switch means so the another resistive voltage divider is connected to be responsive to the gamut of analog signals derived from the digital-to-analog converter means while the converter means is responsive to the signal in the memory indicative of the calibration error of the another resistive voltage divider; and the magnitude of the voltage at the tap of the another resistive voltage is supplied to the instrument to be calibrated.

27. Method of deriving calibrating resistance parameters over multiple ranges for calibrating resistance responses of instruments over multiple ranges, the calibrating parameters being derived with a calibrator having: (a) switch means, (b) a first resistor having a known calibration error, (c) plural second resistors having unknown calibration, (d) a DC reference voltage source having a known calibration error, (e) digital-to-analog converter means, (f) a DC comparator, (g) analog-to-digital converter means, (h) memory means, and (i) circuit means for deriving calibrating output signals over multiple ranges of resistance; the method comprising:

(A) from time to time activating the switch means to connect simultaneously (a) the DC reference voltage source in circuit with the first resistor and at least one of the second resistors, (b) the voltage across the least one second resistor and an output of the digital-to-analog converter means to said comparator, (c) the memory to the digital-to-analog converter means so the digital-to-analog converter means is supplied with signals indicative of the calibration errors of the reference voltage source of the first resistance and the comparator derives an output signal having a magnitude representing the calibration correction error of the at least one of the second resistors, (d) the output of the comparator to the analog-to-digital converter means, and (e) an output of the analog-to-digital converter means representing the calibration correction error of the at least one of the second resistors to the memory;

(B) from time to time, after step A has been performed, connecting said at least one of the second resistors to resistance calibrating input terminals of the instrument being calibrated and connecting a memory location in the calibrator where the calibrating correcting error for said at least one of the second resistors is stored to an output of the calibrator; said instrument being calibrated responding to the resistance connected to the resistance calibrating input terminals to derive a signal having a magnitude dependent on the resistance value at the resistance calibrating input terminals, and offsetting the magnitude of the signal derived by the instrument by the calibrating correcting error for said at least one of the second resistances at the output of the calibrator.

28. The method of claim 27 wherein several of said second resistors are connected as a chain having taps between adjacent values, and during step A connecting different ones of said taps to the comparator while different values of the stored signals representing different resistance values are supplied to the digital-to-analog converter while the digital-to-analog converter output is modified by the stored signals representing the calibrating errors for the reference voltage reference resistance.

29. Apparatus for deriving a signal indicative of a calibration correction for a first resistor having a nominal value to be used in conjunction with calibrating a resistance measuring instrument comprising a reference voltage source having a known calibration error, a second resistor having a known calibration error, an analog comparator, a memory for storing first, second, third and fourth digital signals respectively representing (a) a nominal value for the voltage to be developed across the first resistor, (b) the calibration error for the reference voltage, (c) the calibration error for the second resistor, and (d) the calibration error for the first resistor an analog-to-digital converter, said reference voltage source being connected in circuit with the first and second resistors so that a voltage approximately equal to the nominal voltage is developed across the first resistor, said first resistor and an analog output of the digital-to-analog converter being coupled to the comparator while the digital-to-analog converter is responsive to said first, second and third signals so that the comparator derives an analog signal having a magnitude representing the calibration error of the first resistor, the comparator being connected to an input of the analog-to-digital converter and the analog-to-digital converter being connected to the memory to supply the memory with the fourth signal.

30. In combination, a chain of several first resistors having taps between adjacent pairs of said first resistors, apparatus for deriving signals indicative of calibration corrections for said several first resistors, said apparatus comprising: a reference voltage source having a known calibration error, a second resistor having a known calibration error, an analog comparator, a memory for storing first, second third and fourth digital signals respectively representing (a) a nominal value for the voltage to be developed at each of the taps, (b) the calibration error for the reference voltage, (c) the calibration error for the second resistor, and (d) the calibration error for the first resistor, an analog-to-digital converter, means for connecting said reference voltage and said second resistor in series with each other and selectively to one of said taps and for connecting said one tap to said comparator so that a voltage approximately equal to the nominal voltage at said one tap is developed across said one tap and an analog output of the digital-to-analog converter is coupled to the comparator while the digital-to-analog converter is responsive to said first, second and third signals so that the comparator derives an analog signal having a magnitude representing the calibration error of the resistance at said one tap, the comparator being connected to an input of the analog-to-digital converter and the analog-to-digital converter being connected to the memory to supply the memory with the fourth signal.

31. Method of deriving calibrating current parameters over multiple ranges for calibrating current responses of instruments over multiple ranges, the calibrating parameters being derived with a calibrator having (a) a constant current source adjusted over several values, (b) switch means, (c) a DC reference voltage source having a known calibration error, (d) digital-to-analog converter means, (e) a DC comparator, (f) an analog-to-digital converter, (g) memory means, (h) circuit means for deriving calibrating output signals over multiple current ranges, and (i) impedance means having a known calibration error; the method comprising:

(A) (a) from time to time activating the switch means to connect simultaneously the DC reference voltage source as an input to said constant current source, (b) an output current of the constant current source across the impedance means to that a voltage having a nominal value is developed across the impedance means, (c) the voltage across the impedance means and an output of the digital-to-analog converter means to said comparator, (d) the memory to the digital-to-analog converter means so the digital-to-analog converter means is supplied with signals indicative of the calibration errors of the reference voltage source of the calibrator, (e) impedance means and the comparator derives an output signal having a magnitude representing the calibration correction error of the constant current source, (f) the output of the comparator to the analog-to-digital converter means, and (g) an output of the analog-to-digital converter means representing the calibration correction error of the constant current source to the memory;

(B) from time to time, after step A has been performed, connecting said constant current source to current calibrating input terminals of the instrument being calibrated and (b) connecting a memory location in the calibrator where the calibrating correcting error for said constant current source is stored to an output of the calibrator; said instrument being calibrated responding to the current supplied to the current calibrating input terminals to derive a signal having a magnitude dependent on the magnitude of the current at the current calibrating input terminals and offsetting the magnitude of the signal derived by the instrument by the calibrating correcting error for said current output of the calibrator.

32. The method of claim 31 wherein said impedance means is variable, said memory storing a calibrating error for each of the variable values of the impedance means, and adjusting the value of the impedance means as the amplitude of the current derived from the constant current source is adjusted so that the nominal voltage supplied to the comparator across the impedance means remains approximately constant, the digital-to-analog converter means being responsive to signals from the memory means indicative of the calibrating error for each of the variable values of the impedance means as different values of the impedance means are connected to be responsive to current from the constant current source.

33. Apparatus for deriving a signal indicative of a calibration correction for a constant current source having a nominal value to be used in conjunction with calibrating a current measuring instrument comprising a reference voltage source having a known calibration error, a resistor having a known calibration error, an analog comparator, a memory for storing first, second, third and fourth digital signals respectively representing (a) a nominal value for the voltage to be developed across the resistor, (b) the calibration error for the reference voltage, (c) the calibration error for the second resistor, and (d) the calibration error for the constant current source, an analog-to-digital converter, said reference voltage source being connected in circuit with the constant current source resistor so that a voltage approximately equal to the nominal voltage is developed across the resistor; said resistor and an analog output of the digital-to-analog converter being coupled to the comparator while the digital-to-analog converter is responsive to said first, second and third signals so that the comparator derives an analog signal having a magnitude representing the calibration error of the constant current source, the comparator being connected to an input of the analog-to-digital converter and the analog-to-digital converter being connected to the memory to supply the memory with the fourth signal.

34. In combination, a constant current source including means for deriving currents having several different magnitudes, said source being responsive to a reference voltage source having a known calibration correction error, apparatus for deriving calibration errors for said several different magnitudes, said apparatus comprising: variable resistance means having a known calibration error at each of said several predetermined values, said resistance means being connected to be responsive to the output current of the constant current source so that a nominal voltage is developed across said variable resistance means for each current magnitude derived by said source, an analog comparator, a memory for storing first, second, third and fourth digital signals respectively representing (a) nominal values for the voltages to be developed across the resistance means, (b) the calibration error for the reference voltage, (c) the calibration error for the resistance means, and (d) calibration errors for different magnitudes of the current source, an analog-to-digital converter, said resistance means and an analog output of the digital-to-analog converter being coupled to the comparator while the digital-to-analog converter is responsive to said first, second and third signals so that the comparator derives an analog signal having a magnitude representing the calibration error of the current source for the value of the current derived by the source and the value of the variable resistance means responsive to the current derived by the source, the comparator being connected to an input of the analog-to-digital converter and the analog-to-digital converter being connected to the memory to supply the memory with the fourth signal.

35. In a method of deriving calibrating voltage and/or current and/or resistance parameters over multiple ranges for calibrating voltage and/or current and/or resistance responses of instruments over multiple ranges, the calibrating parameters being derived with a calibrator having: (a) input terminals responsive to an external standard source of at least one of said parameters having a precise value, (b) switch means, (c) a DC reference voltage source, (d) digital-to-analog converter means, (e) a DC comparator, (f) an analog-to-digital converter, (g) memory means, and (h) circuit means for deriving calibrating output signals over multiple ranges for at least one of said parameters; the method comprising:

(A) from time to time connecting an external DC voltage standard having a precise magnitude to said input terminals while activating said switch means to connect simultaneously (a) one of said input terminals to an input of said comparator, (b) said DC reference source and a signal from said memory means as inputs to said digital-to-analog converter means, a digital output indicative of said magnitude of the DC reference source and the signal from the memory means causing the digital-to-analog converter means to derive a DC signal nominally having a predetermined magnitude relative to the magnitude of the voltage standard, (c) said digital-to-analog converter means to an input of said comparator, (d) an output of said comparator indicative of the magnitude of the deviation of said inputs thereof to said analog-to-digital converter means, and (e) an output of said analog-to-digital converter means to said memory means; the output of the analog-to-digital converter means supplied to said memory means being indicative of a calibrating error of the digital-to-analog converter means while supplied with the voltage of the DC reference voltage source;

(B) from time to time, after step A has been performed at least once, activating said switch means to connect simultaneously (a) said DC reference source to an input of said comparator, (b) said DC reference source and a signal from said memory means as inputs to said digital-to-analog converter means, a digital output indicative of said magnitude of the DC reference source and the signal from the memory means causing the digital-to-analog converter means to derive a DC signal nominally having a predetermined magnitude relative to the magnitude of the DC reference source, the memory also supplying to the digital-to-analog converter means with a signal indicative of the calibrating error derived during step A, (c) said digital-to-analog converter means to an input of said comparator, (d) an output of said comparator indicative of the magnitude of the deviation of said input thereof to said analog-to-digital converter means, and (e) an output of said analog-to-digital converter means to said memory means; the output of the analog-to-digital converter means supplied to said memory means being indicative of a calibrating error of the DC reference source;

36. In a method of deriving calibration voltage and/or current and/or resistance parameters over multiple ranges for calibrating voltage and/or current and/or resistance responses of instruments over multiple ranges, the calibrating parameters being derived with a calibrator having: (a) switch means, (b) a DC reference voltage source having a known calibration error, (c) digital-to-analog converter means, (d) a DC comparator, (e) an analog-to-digital converter, (f) memory means and (g) circuit means for deriving calibrating output signals over multiple ranges for at least one of said parameters, the memory means storing signals indicative of the known calibration errors; the method comprising:

(A) from time to time, activating said switch means to connect simultaneously (a) said DC reference source to an input of said comparator, (b) said DC reference source and a signal from said memory means as inputs to said digital-to-analog converter means, a digital output indicative of said magnitude of the DC reference source and the signal from the memory means causing the digital-to-analog converter means to derive a DC signal nominally having a predetermined magnitude relative to the magnitude of the DC reference source, the memory also supplying to the digital-to-analog converter a signal indicative of the known calibrating errors of the DC reference source and the digital-to-analog converter, (c) digital-to-analog converter means to an input of said comparator, (d) an output of said comparator indicative of the magnitude of the deviation of said input thereof to said analog-to-digital converter means, and (e) an output of said analog-to-digital converter means to said memory means; the output of the analog-to-digital converter means supplied to said memory means being indicative of a calibrating errors of the DC reference source and the digital-to-analog converter means;

(B) from time to time, after step A has been performed at least once, activating the switch means to connect simultaneously (a) said DC reference source and said memory means as inputs to said digital-to-analog converter means, and (b) said DC reference source, said comparator, said digital-to-analog converter means output and said circuit means to each other while digital-to-analog converter means responds to the known calibrating error signals and the calibrating signal error derived during step A so that the comparator derives a signal indicative of a calibrating error for the circuit means.

37. The method of claim 36 further comprising: from time to time, after step B has been performed at least once, deriving a sequence of at least one of said calibrating parameters by: (i) activating the switch means to connect simultaneously (a) said DC reference source and said memory means to inputs of said digital-to-analog converter means, and (b) the output of said digital-to-analog converter means to said circuit; and (ii) with the connection of (i) established and the digital-to-analog converter means being responsive to the calibrating errors derived during step B, activating the memory means to supply signals representing a gamut of values of the at least one parameter to the digital-to-analog converter means to that the circuit means derives a gamut of analog values, one for each range, of the at least one parameter, each of the analog values in the gamut being calibrated for errors derived during step B and suitable for calibrating the instrument.

* * * * *